(12) United States Patent
Okuyama et al.

(10) Patent No.: US 7,737,629 B2
(45) Date of Patent: Jun. 15, 2010

(54) LIGHT EMITTING DEVICE, METHOD OF MANUFACTURING THE SAME, AND ELECTRONIC APPARATUS

(75) Inventors: Tomoyuki Okuyama, Chino (JP); Mutsumi Kimura, Kyotanabe (JP)

(73) Assignee: Seiko Epson Corporation, Tokyo (JP)

( * ) Notice: Subject to any disclaimer, the term of this patent is extended or adjusted under 35 U.S.C. 154(b) by 586 days.

(21) Appl. No.: 11/391,376

(22) Filed: Mar. 29, 2006

(65) Prior Publication Data

US 2006/0220544 A1    Oct. 5, 2006

(30) Foreign Application Priority Data

Mar. 31, 2005   (JP)   ............... 2005-102552
Mar. 31, 2005   (JP)   ............... 2005-102553

(51) Int. Cl.
*H05B 33/00* (2006.01)

(52) U.S. Cl. ...................... 313/506; 313/498

(58) Field of Classification Search .......... 313/504–506
See application file for complete search history.

(56) References Cited

U.S. PATENT DOCUMENTS 6,339,288 B1 * 1/2002 Qian et al. ............... 313/498
6,693,296 B1    2/2004 Tyan
6,870,186 B2    3/2005 Park et al.
7,279,715 B2   10/2007 Park et al.
7,550,774 B2    6/2009 Inoue et al.
2003/0136966 A1  7/2003 Inoue et al.
2009/0224663 A1  9/2009 Inoue et al.

FOREIGN PATENT DOCUMENTS

| JP | A-2000-029404 | 1/2000 |
|---|---|---|
| JP | A-2000-089691 | 3/2000 |
| JP | A-2002-313572 | 10/2002 |
| JP | A-2004-6337 | 1/2004 |
| JP | A-2004-071570 | 3/2004 |
| JP | A-2004-234868 | 8/2004 |
| KR | 10-2004-0014302 A | 2/2004 |
| KR | 10-2004-0068401 A | 7/2004 |
| WO | WO 03/053109 A1 | 6/2003 |
| WO | WO 2004/044987 A2 | 5/2004 |

* cited by examiner

*Primary Examiner*—Joseph L Williams
(74) *Attorney, Agent, or Firm*—Oliff & Berridge, PLC

(57) ABSTRACT

A light emitting device includes: a plurality of first electrodes; a plurality of second electrodes; and a plurality of light emitting films. Each of the plurality of light emitting films is disposed between one first electrode among the plurality of first electrodes and one second electrode among the plurality of second electrodes. The one first electrode is electrically connected to the second electrode that is adjacent to the one second electrode among the plurality of second electrodes.

16 Claims, 17 Drawing Sheets

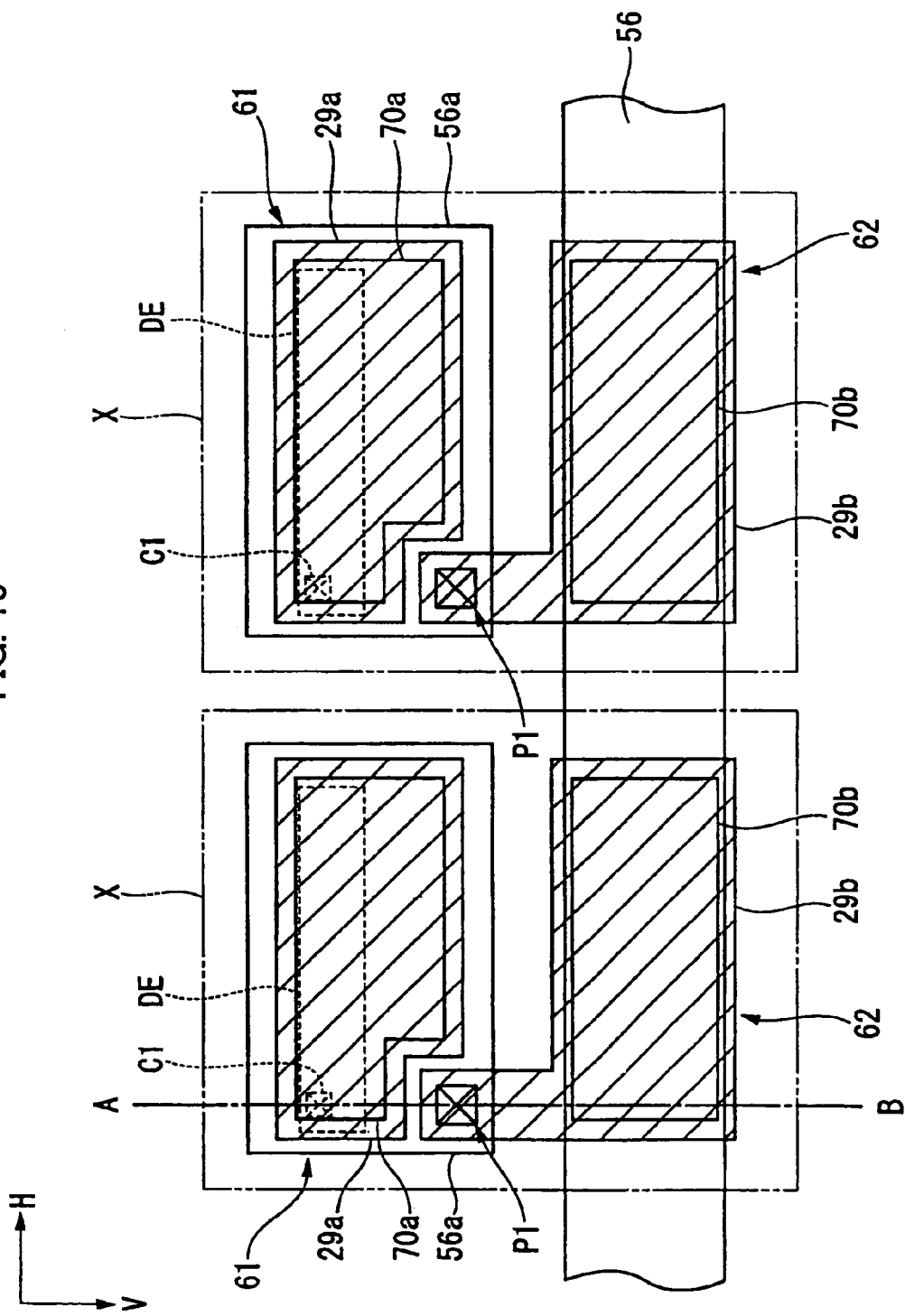

US 7,737,629 B2

LIGHT EMITTING DEVICE, METHOD OF MANUFACTURING THE SAME, AND ELECTRONIC APPARATUS

BACKGROUND

1. Technical Field

The present invention relates to a light emitting device such as an organic EL device, a method of manufacturing the same, and an electronic apparatus.

2. Related Art

Recently, as a self-emitting element, which does not require a backlight or the like, an organic EL device provided with an organic electro-luminescence (hereinafter, referred to as an organic EL) element has attracted attention. An organic EL element is constructed so as to be provided with an organic EL layer, that is, a light emitting element between a pair of electrodes opposite to each other, and an organic EL device performing full-color display is provided with a light emitting element having an emission wavelength band corresponding to respective colors of red (R), green (G), and blue (B). If a voltage is applied between the pair of electrodes opposite to each other, the injected electrons and holes are recombined within a light emitting film, so that the light emitting film emits light. The light emitting film formed in such an organic EL device is formed of a thin film having a thickness of less than 1 μm. Further, the organic EL device does not need a backlight which is used in a liquid crystal display device according to the related art, because the light emitting film itself emits light. Therefore, the organic EL device has an advantage in that the thickness thereof can be thinly reduced.

However, even though the organic EL device is required to be increased in size, the wiring length of the power line or the like increases as the organic EL device increases in size. As a result, a voltage drop becomes prominent. Therefore, as the organic EL device increases in size, the reduction I the luminance around the center of a light emitting region becomes more prominent. As a method for solving the problems, it is proposed in JP-A-2000-89691 that a plurality of adjacent light emitting elements which are connected in series are provided in one pixel. When a voltage V [V] is applied to one light emitting element, current I [A] flows in the light emitting element, so that light emission luminance L [cd/m$^2$] is obtained. If n light emitting elements (n is an integer larger than two) are connected in series and a voltage of nV [V] is applied, the current of I/n [A] may be applied to the respective light emitting elements, in order to set the average light emission luminance of the respective light emitting elements to L [cd/m$^2$]. Since the current is reduced from I [A] to I/n [A] so as to obtain the same light emission luminance, a voltage drop ΔV due to wiring resistance R is reduced by 1/n. As a result, the reduction in luminance around the center of the light emitting region can be suppressed.

As a method of manufacturing the organic EL device having such a construction, JP-A-2004-71570 discloses a method in which the formation of a light emitting film of the organic EL element and the formation of a cathode after the formation of the light emitting film are performed by using a mask. Further, JP-A-2002-313572 discloses a method in which a barrier having a reversed-tapered shape is formed and a light emitting film and cathode of the organic EL element are formed by evaporation.

Recently, however, the following method has attracted attention. Liquid material including a forming material of a light emitting film of an organic EL element is coated on a substrate by an inkjet method. Then, the liquid material is dried, thereby forming a light emitting film. The inkjet method is expected to be used when various microstructures as well as the light emitting film of the organic EL element are formed. When the inkjet method is used, an expensive mask is not needed, as compared with the case where a mask is used to form a microstructure. Therefore, there is an advantage in that the organic EL device can be reduced in cost. Further, the microstructure can be formed only by discharging the material only where it is required, which reduces the amount of resources being used.

The organic EL device having the structure disclosed in JP-A-2000-89691 can be manufactured, if the techniques disclosed in JP-A-2004-71570 and JP-A-2002-313572 are used. However, only substituting one manufacturing process (for example, a forming process of a light emitting film of an organic EL element) with the inkjet method does not allow an organic EL device to exercise the desired function to be manufactured.

SUMMARY

A light emitting device, according to an aspect of the present invention, includes: a plurality of first electrodes; a plurality of second electrodes; and a plurality of light emitting films. Each of the plurality of light emitting films is disposed between one first electrode among the plurality of first electrodes and one second electrode among the plurality of second electrodes, and the one first electrode is electrically connected to the second electrode that is adjacent to the one second electrode among the plurality of second electrodes.

In the light emitting device, the plurality of first electrodes may be separated from each other by an insulating member, the plurality of second electrodes may be separated from each other by an insulating member, and the plurality of light emitting films may be separated from each other by an insulating member.

In the light emitting device, the plurality of second electrodes may be separated by a first insulating member having a first tapered shape.

In the light emitting device, a second insulating member which comes in contact with the first insulating member and has a tapered shape reverse to the first tapered shape may be provided.

The light emitting device can be used in a display section or the like of an electronic apparatus.

A method of manufacturing a light emitting device, according to another aspect of the invention, includes: forming a plurality of first electrodes on a first substrate; forming a first insulating member which separates the plurality of first electrodes from each other; forming a second insulating member on the first insulating member, the second insulating member having a tapered shape which is reverse to the tapered shape of the first insulating member; discharging liquid material including a forming material of a light emitting film on the plurality of first electrodes through a droplet discharge method so as to form a light emitting film on each of the plurality of first electrodes; and evaporating forming materials of second electrodes so that the second electrodes are separated from each other by the second insulating member, and further, forming the second electrodes so as to be connected to at least one first electrode among the plurality of first electrodes.

In order to solve the above-described problems, the organic EL device of the invention, which is provided with a plurality of pixels, includes a plurality of first electrodes that are separated by a partition wall within the pixel; a plurality of light emitting sections that are formed on the respective upper portions of the plurality of first electrodes by a droplet discharge method; a plurality of second electrodes that are separated by a reversed-tapered separating member. Further, the organic EL device is provided with a first substrate including a plurality of light emitting elements that are connected in series so that the first and second electrodes adjacent to each other within the pixel are connected; and a second substrate including a plurality of driving elements that are provided to correspond to the respective pixels so as to cause the light emitting elements provided in the corresponding pixel to emit light.

According to the aspect of the invention, each of the plurality of pixels is provided with the plurality of light emitting elements connected in a series. Therefore, the current flowing in the respective light emitting elements can be reduced to 1/n current (n is the number of light emitting elements provided in the pixel). As a result, the reduction in luminance around the center of a display region due to a voltage drop can be suppressed. Further, since current can be reduced, the wiring lines for supplying electric power can be thinned. As a result, high precision can be realized.

In the organic EL device of the aspect of the invention, each of the plurality of pixels is provided with two to four light emitting elements.

Due to the number of light emitting elements provided in each pixel increasing, the amount of current can be reduced. Therefore, the larger the number of light emitting elements provided in each pixel, the better in terms of the reduction in luminance. However, as the number of light emitting elements provided in each pixel increases, the number of barriers increases, thereby reducing an aperture ratio. Therefore, in consideration of both the reduction in luminance and the reduction in aperture ratio, the number of the light emitting elements within each pixel is preferably in the range of two to four.

In the organic EL device of the aspect of the invention, the light emitting section is formed to include a hole transporting layer and a light emitting film.

According to the aspect of the invention, the light emitting section is formed to include the hole transporting layer and the light emitting film. Therefore, if a hole injection ratio with respect to the light emitting film formed by a droplet discharge method is bad, the injection ratio can be improved by the hole transporting layer.

In the organic EL device according to the aspect of the invention, the second substrate may serve as a sealing substrate which seals the first substrate.

In the organic EL device according to the aspect of the invention, the driving element provided in the second substrate is preferably connected to the second electrode of the light emitting element, which is positioned at the end portion of the pixel, through a conductive connection member, among the light emitting elements provided in the corresponding pixel.

In the organic EL device according to the aspect of the invention, the driving element selectively transfers some of the multiple elements formed on a predetermined substrate onto the second substrate, so that the elements are provided in the second substrate.

In order to solve the above-described problems, a method of manufacturing the organic EL device, which is provided with a plurality of pixels, includes forming a plurality of first electrodes within the pixel on a first substrate; forming a barrier separating the first electrodes within the pixel at least between the first electrodes; forming a separating member having a reversed-tapered shape on the barrier; discharging liquid material including a forming material of a light emitting film onto the first electrode through a droplet discharge method so as to form a light emitting film on the respective upper portion of the first electrodes; evaporating forming materials of second electrodes on the first substrate so that the second electrodes are separated by the separating member and further forming the second electrode connected to the first electrode formed in the adjacent position; and disposing the second substrate to be electrically connected to the light emitting elements of the pixel corresponding to the respective driving element, the second substrate having the plurality of driving elements which are provided to correspond to the respective pixels and cause the light emitting elements provided in the corresponding pixel to emit light.

According to the aspect of the invention, each of the plurality of pixels is provided with the plurality of light emitting elements connected in series. Therefore, the current flowing in the respective light emitting elements can be reduced to 1/n current (n is the number of light emitting elements provided in the pixel). As a result, the reduction in luminance around the center of a display region due to a voltage drop can be suppressed. Further, since current can be reduced, the wiring lines for supplying electric power can be thinned. As a result, high precision can be realized. Further, since the light emitting film is formed by a droplet discharge method, a forming material of the light emitting film can be used without being wasted, so that resources are saved.

In the method of manufacturing an organic EL device according to the aspect of the invention, each of the plurality of pixels is provided with two to four light emitting elements.

Due to the number of light emitting elements provided in each pixel increasing, the amount of current can be reduced. Therefore, the larger the number of light emitting elements provided in each pixel, the better in terms of the reduction in luminance. However, as the number of light emitting elements provided in each pixel increases, the number of barriers increases, thereby reducing an aperture ratio. Therefore, in consideration of both the reduction in luminance and the reduction in aperture ratio, the number of the light emitting elements within each pixel is preferably in the range of two to four.

The method of manufacturing an organic EL device according to the aspect of the invention includes forming a hole transporting layer on the upper or lower portion of the light emitting film.

According to the aspect of the invention, the hole transporting layer is formed on the upper or lower portion of the light emitting film. Therefore, if a hole injection ratio with respect to the light emitting film formed by a droplet discharge method is bad, the injection ratio can be improved by the hole transporting layer.

In the method of manufacturing an organic EL device according to the aspect of the invention, the second substrate is disposed with respect to the first substrate so that the second substrate may serve as a sealing substrate which seals the first substrate.

In the method of manufacturing an organic EL device according to the aspect of the invention, the driving element provided in the second substrate is preferably connected to the second electrode of the light emitting element, which is positioned at the end portion of the pixel, through a conductive connection member, among the light emitting elements provided in the corresponding pixel.

A method of manufacturing an organic EL device according to another aspect of the invention includes forming the plurality of driving elements on a predetermined substrate; and selectively transferring some of the plurality of driving elements formed on the predetermined substrate onto the second substrate so that the driving elements are also provided in the second substrate.

The electronic apparatus of the aspect of the invention is provided with the organic EL device according to the above-described aspects or the organic EL device manufactured by the method of manufacturing an organic EL device according to the above-described aspects.

According to the construction, an electronic apparatus having an excellent display characteristic can be provided.

BRIEF DESCRIPTION OF THE DRAWINGS

The invention will be described with reference to the accompanying drawings, wherein like numbers reference like elements.

FIG. 15 is an enlarged transparent plan view showing a pixel region X according to an exemplified embodiment of the invention.

DESCRIPTION OF EXEMPLARY EMBODIMENTS

Hereinafter, an organic EL device, a manufacturing method thereof, and an electronic apparatus according to an embodiment of the present invention will be described in detail with reference to the drawings. The embodiment to be described below shows a part of the invention. Without limiting the invention, variations and modifications can be made within the spirit and scope of the invention. Further, in the following drawings, a reduced scale is set to be different for each layer and member, in order to set each layer and member in such a size that the layer and member are recognizable.

Organic EL Device

Figure 1:
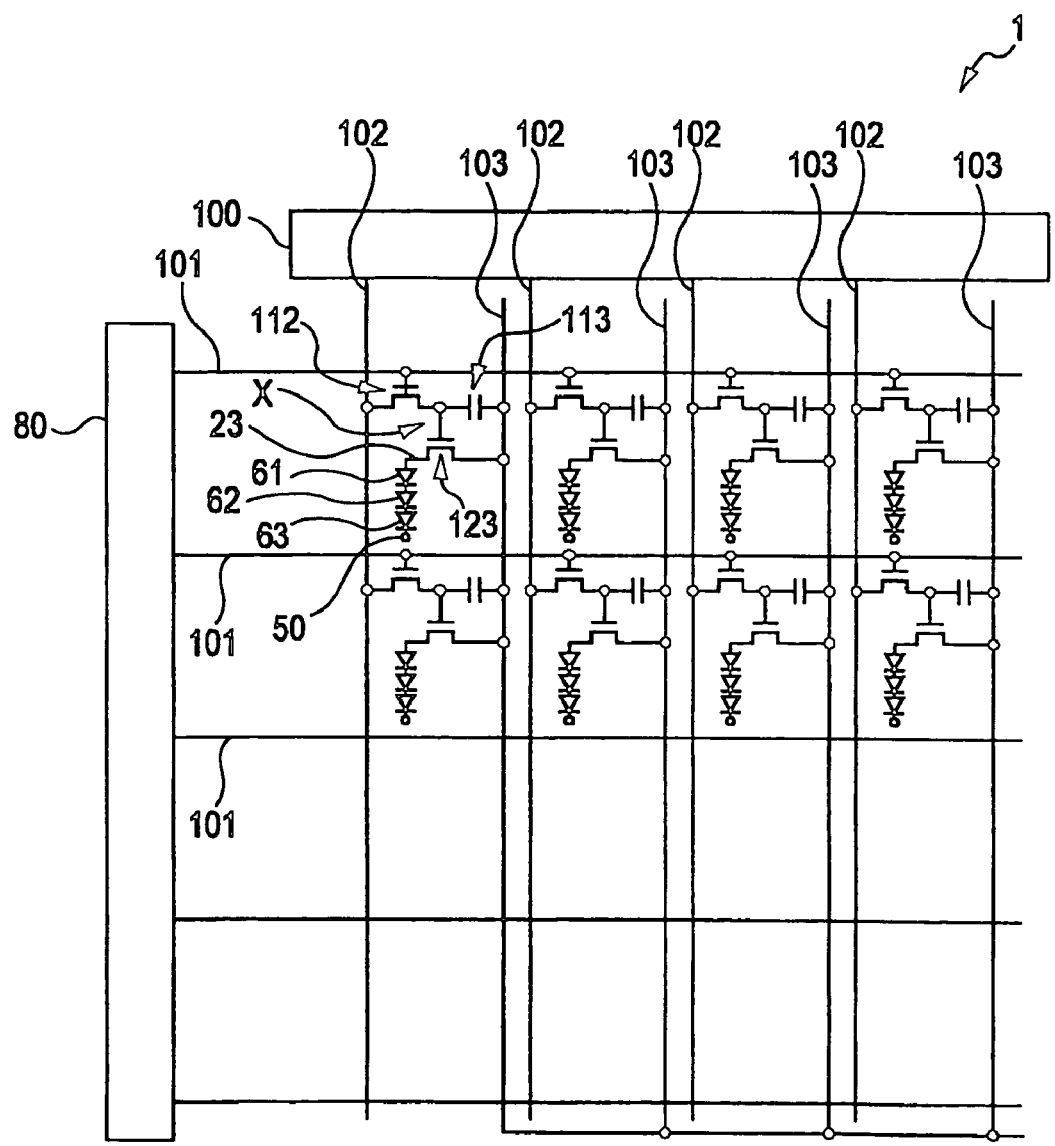
FIG. 1 is a schematic view showing the wiring structure of an organic EL device according to an embodiment of the present invention.

FIG. 1 is a schematic view showing the wiring structure of the organic EL device according to an embodiment of the invention. The organic EL device shown in FIG. 1 is an active-matrix-type device using a thin film transistor (TFT) as a switching element, and has a wiring structure composed of a plurality of scanning lines 101, a plurality of signal lines 102 extending in the direction intersecting orthogonally to the respective scanning lines 101, and a plurality of power lines 103 extending in parallel to the respective signal lines 102. In the vicinity of each intersection of the scanning lines 101 with the signal lines 102, a pixel region X is formed.

The signal lines 102 are connected to a data line driving circuit 100 which is provided with a shift register, level shifter, video lines, and an analog switch. Further, the scanning lines 101 are connected to a scanning line driving circuit 80 which is provided with a shift register and a level shifter.

In each pixel region X, there are provided a switching TFT 112 in which the gate electrode receives a scanning signal through the scanning line 101, a holding capacitor 113 which holds a pixel signal supplied from the signal line 102 through the switching TFT 112, a driving TFT 123 of which the gate electrode receives the pixel signal held by the holding capacitor 113, a pixel electrode 23 (electrode) into which driving current flows from the power line 103 when the electrode is electrically connected to the power line 103 through the driving TFT 123, and a plurality of organic EL elements 61, 62, and 63 which are disposed between the pixel electrode 23 and a common electrode 50.

The plurality of organic EL elements 61, 62, and 63 disposed between the pixel electrode 23 and the common electrode 50 are connected in series. The plurality of organic EL elements 61, 62, and 63 emit light independently from each other. In such a construction in which the plurality of light emitting elements are provided in each pixel electrode X, the reduction in light emission luminance of each pixel region X is prevented, which occurs due to an increase in voltage drop when the wiring length of the power line 103 is lengthened as the organic EL device 1 is increased in size. Moreover, since current flowing in the power line 103 can be reduced, the power line 103 is thinned down so that high precision can be realized.

In the present embodiment, when the number of organic EL elements provided in the pixel region X is set to n, n times as large as voltage is applied to the power line 103, compared with a case where one organic EL element is provided in the pixel region X. Accordingly, the current flowing in the power line 103 can be reduced to 1/n of current, without changing the light emission luminance of one pixel region X. As a result, the reduction in light emission luminance of each pixel region X can be prevented, which occurs due to voltage drop.

Even though the construction where three organic EL elements 61, 62, and 63 are provided in the pixel region X has been exemplified in the present embodiment, the number of organic EL elements provided in the pixel region X is properly set in consideration of desired performance. However, the larger the number of organic EL elements provided in each pixel, the lower the aperture ratio. Therefore, in consideration of both the reduction in luminance and the reduction in aperture ratio, the number of organic EL elements within a pixel is preferably in the range of 2 to 4.

According to the organic EL device 1 having such a construction, when the scanning line 101 is driven so that the switching TFT 112 is turned on, the electric potential of the signal line 102 at this time is held by the holding capacitor 113, and the on/off state of the driving TFT 123 is determined in accordance with the state of the holding capacitor 113. Then, an electric current flows into the pixel electrode 23 from the power line 103 through the channel of the driving TFT 123, and thereafter further flows into the organic elements 61, 62, and 63. The organic elements 61, 62, and 63 emit light according to an amount of current flowing therein.

Figure 2:
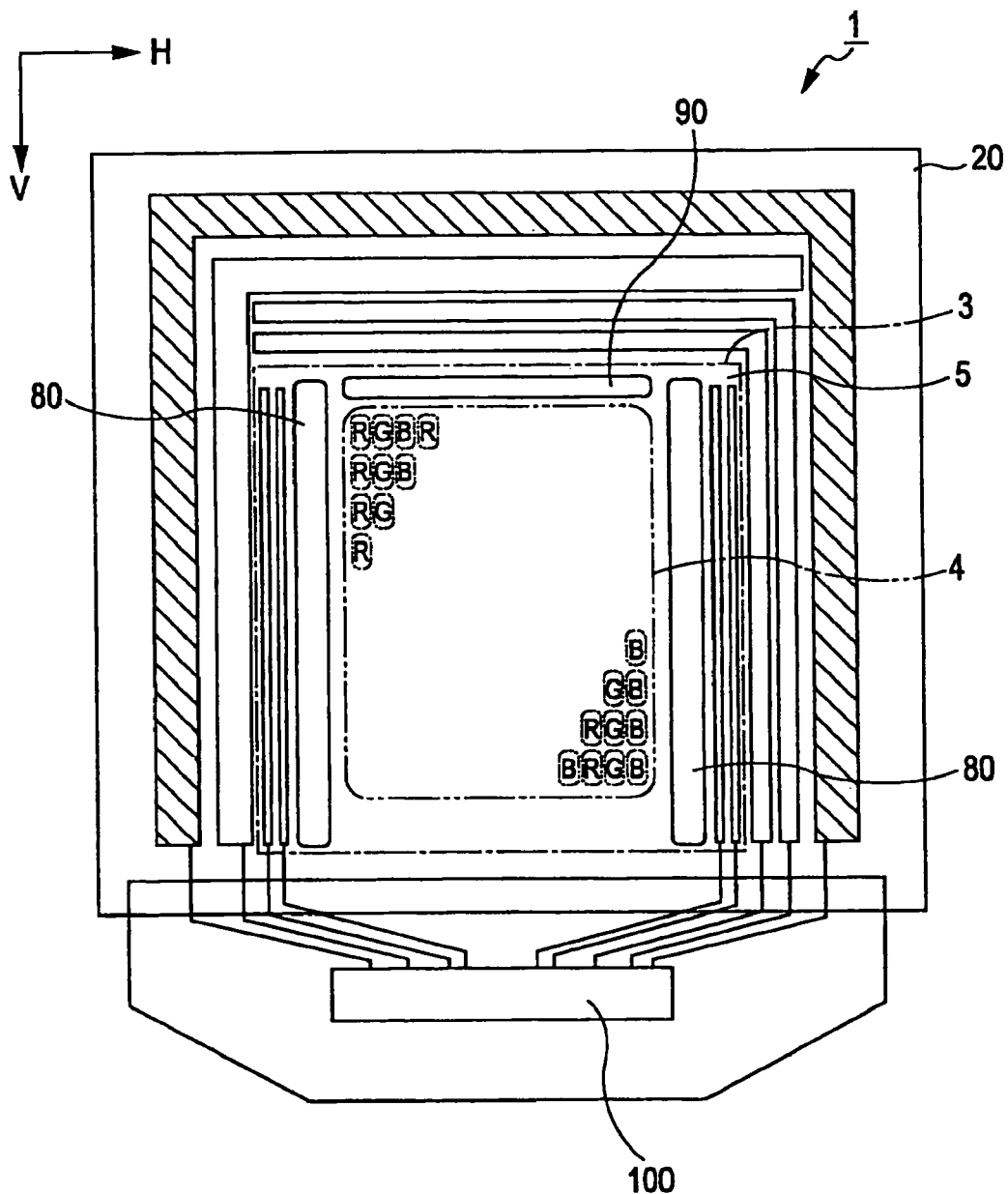
FIG. 2 is a plan view schematically showing the construction of the organic EL device according to an embodiment of the invention.

FIG. 2 is a plan view schematically showing the construction of the organic EL device 1 according to an embodiment of the invention. As shown in FIG. 2, the organic EL device 1 of the present embodiment is provided with a substrate 20 having optical transparency and electrical insulating properties, a pixel electrode region (not shown) in which the pixel electrodes connected to the switching TFT (not shown) are disposed in a matrix shape on the substrate 20, the power lines 103 which are disposed around the pixel electrode region and are connected to the respective pixel electrodes, and a pixel section 3 (shown by a dashed line in FIG. 2) which is positioned at least on the pixel electrode region, the pixel section 3 being formed in a substantially rectangular shape in plan view. Moreover, the pixel section 3 in the present embodiment is compartmented into an actual display region 4 (shown by a double-dashed line) of the center portion thereof and a dummy region 5 (a region between the dashed line and the double-dashed line) disposed around the actual display region 4.

In the actual display region 4, display regions R, G, and B each having a pixel electrode are disposed regularly in the H and V directions of the drawing. The respective display regions R, G, and B form the display region X shown in FIG. 1. Further, in both sides of the actual display region 4 in FIG. 2, scanning line driving circuits 80 and 80 are disposed. The scanning line driving circuits 80 and 80 are provided to be positioned below the dummy region 5. Furthermore, in the upper side of the actual display region 4 in FIG. 2, a checking circuit 90 is disposed. The checking circuit 90 is provided to be disposed below the dummy region 5. The checking circuit 90, which checks the operation of the organic EL device 1, is provided with, for example, a checking information output unit (not shown) which outputs a checking result to the outside. The checking circuit 90 is constructed so as to check the quality and defect of a display device during manufacturing or before shipment.

The driving voltage of the scanning line driving circuit 80 and checking circuit 90 is applied from a predetermined power supply section through a voltage conductive section (not shown). The driving control signal and driving voltage into the scanning line driving circuit 80 and checking circuit 90 are transmitted and applied through a signal conducting section (not shown) from a predetermined main driver which controls the operation of the organic EL device 1. Moreover, the driving control signal, in this case, is an instruction signal from a main driver which is associated with the control when the scanning line driving circuit 80 and checking circuit 90 output signals.

Figure 3:
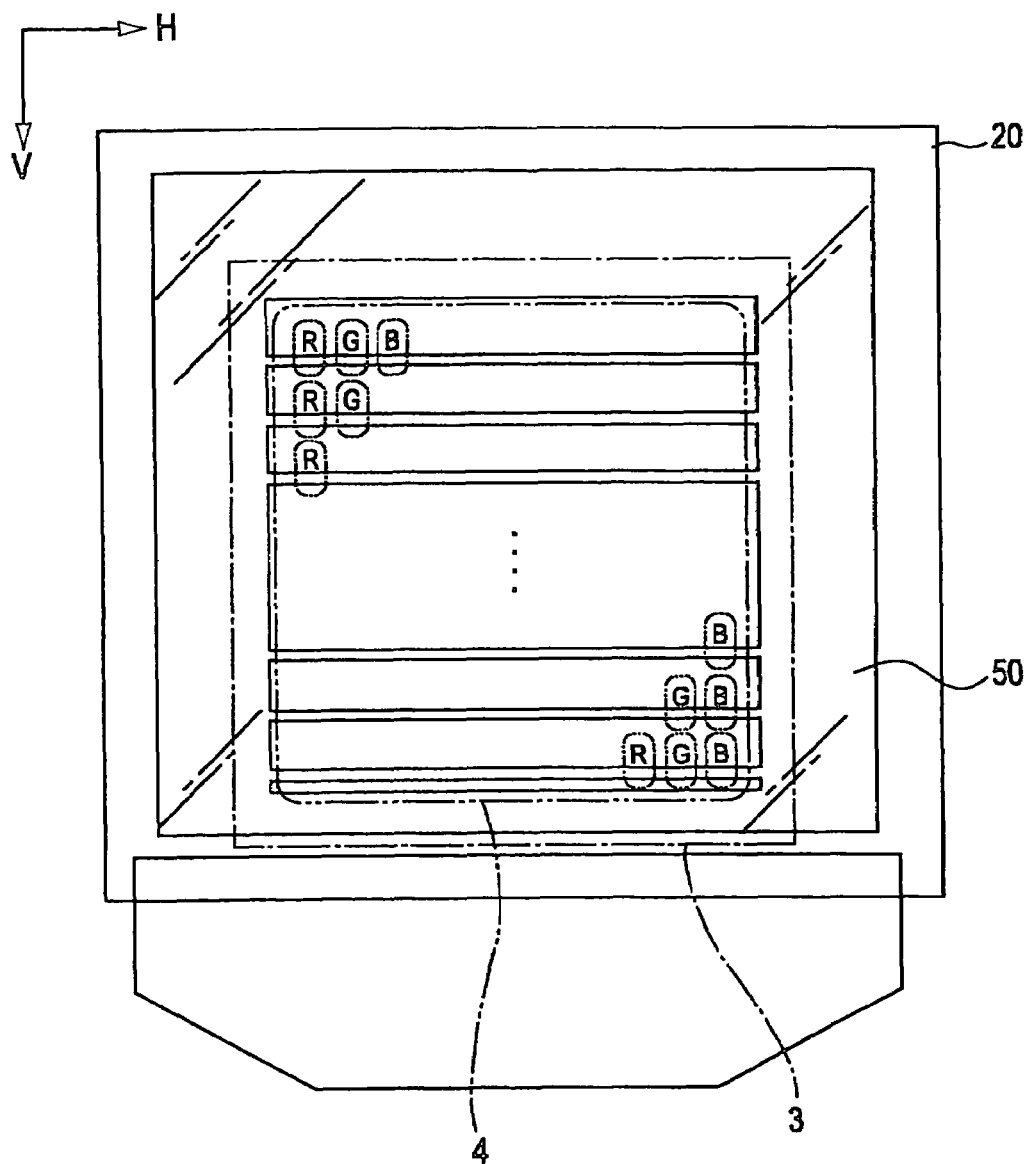
FIG. 3 is a transparent plan view illustrating the organic EL device according to an embodiment of the invention.

FIG. 3 is a transparent plan view illustrating the organic EL device 1 according to an embodiment of the invention. In FIG. 3, the pixel section 3, the actual display region 4, and the display regions R, G, and B are shown together in order to clarify the relationship with FIG. 2. As shown in FIG. 3, a transparent common electrode 50 is provided on the front surface side of the organic EL device 1. The transparent common electrode 50 formed of an ITO or the like is formed on the rear surface (the rear surface side of the organic EL device 1) of the substrate 20 having optical transparency.

In the center portion corresponding to the actual display region 4, the common electrode 50 extends in the H direction of the drawing and is formed in a plurality of bands arranged at predetermined intervals (arrangement interval of the display region) in the V direction of the drawing. Even though the detailed descriptions will be described below, the common electrode 50 of the organic EL device 1 of the present embodiment is formed in the shape shown in FIG. 3, because the plurality of organic EL devices connected in series are provided in the pixel region X as shown in FIG. 1. Moreover, in the center of the common electrode 50, transparent electrodes 50a and 50b (refer to FIG. 5) made of the same material as the common electrode are formed in portions other than the band-shaped portions. The transparent electrodes 50a and 50b are insulated from each other.

Figure 4:
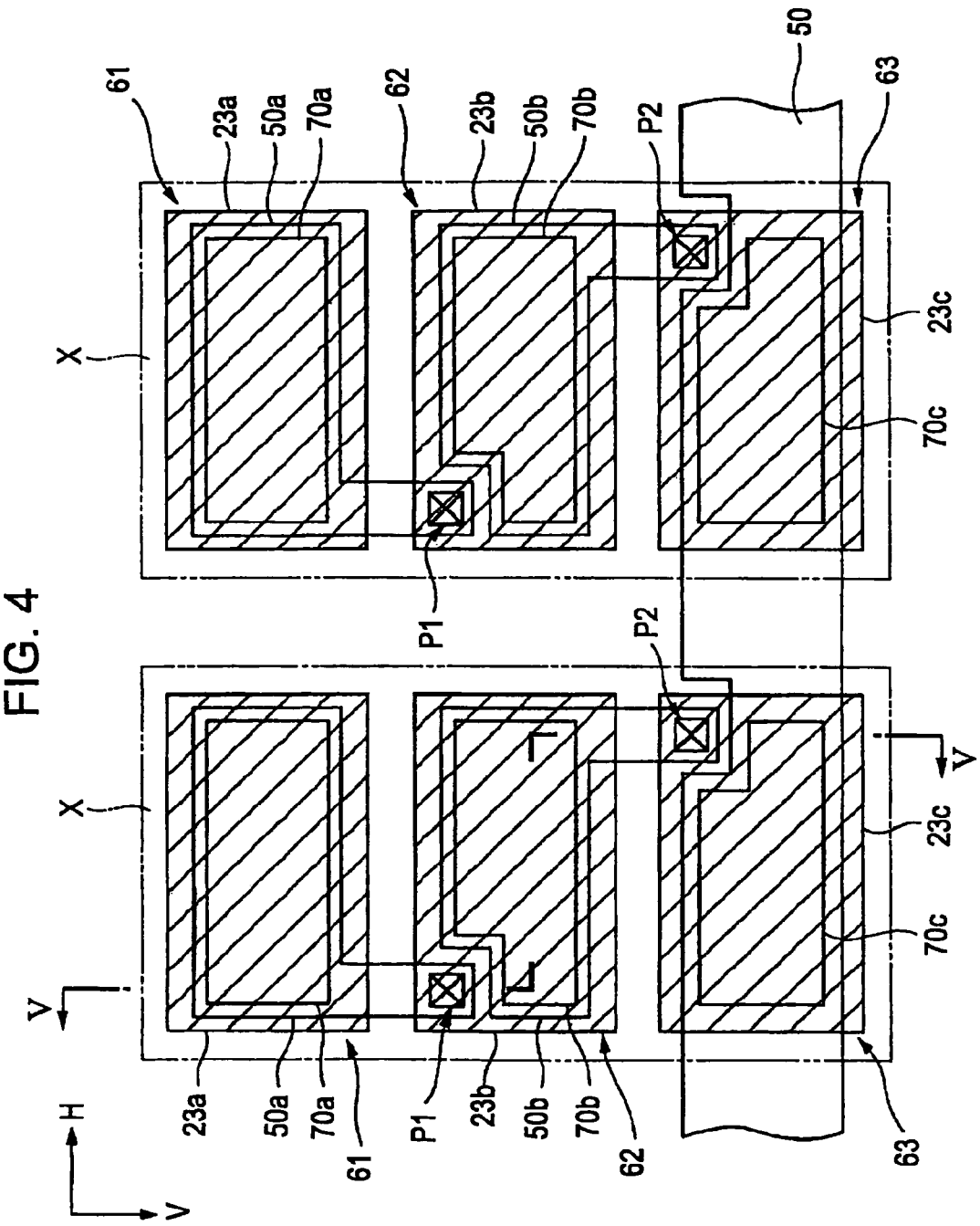
FIG. 4 is an enlarged transparent plan view showing a pixel region X according to an exemplified embodiment of the invention.

FIG. 4 is an enlarged transparent plan view showing the pixel region X. In FIG. 4, two pixel regions X adjacent to each other in the H direction of FIG. 2 are enlarged. The switching TFT 112, the holding capacitor 113, the driving TFT 123, the scanning line 101, the signal line 102, and the power line 103, which are shown in FIG. 1, are omitted in the drawing. As shown in FIG. 4, three organic EL elements 61, 62, and 63 shown in FIG. 1 are formed in the pixel region X.

The organic EL element 61 includes the transparent electrode 50a, a light emitting film 70a formed on the lower side of the transparent electrode 50a, and an electrode 23a formed on the lower side of the light emitting film 70a. The organic EL element 62 includes the transparent electrode 50b, a light emitting film 70b formed on the lower side of the transparent electrode 50b, and an electrode 23b formed on the lower side of the light emitting film 70b. Further, the organic EL element 63 includes the common electrode 50, a light emitting film 70c formed on the lower side of the common electrode 50, and an electrode 23c formed on the lower side of the light emitting film 70c. The electrode 23a provided in the organic EL element 61 corresponds to the element electrode 23 shown in FIG. 1. As shown in FIG. 3, the common electrode 50 extends in the H direction of the drawing and is commonly used by the organic EL element 63 provided in the end portion of the pixel region X in the V direction, the pixel region X being arranged in the H direction.

The transparent electrode 50a of the organic EL element 61 and the electrode 23b of the organic EL element 62 come in contact with each other at a place, where reference numeral P1 is attached, so as to be electrically connected. Further, the transparent electrode 50b of the organic EL element 62 and the electrode 23c of the organic EL element 62 come in contact with each other at a place, where reference numeral P2 is attached, so as to be electrically connected. As such, between the common electrode 50 and the electrode 23a corresponding to the pixel electrode 23 shown in FIG. 1, the organic EL elements 61, 62, and 63 are connected in series.

Figure 5:
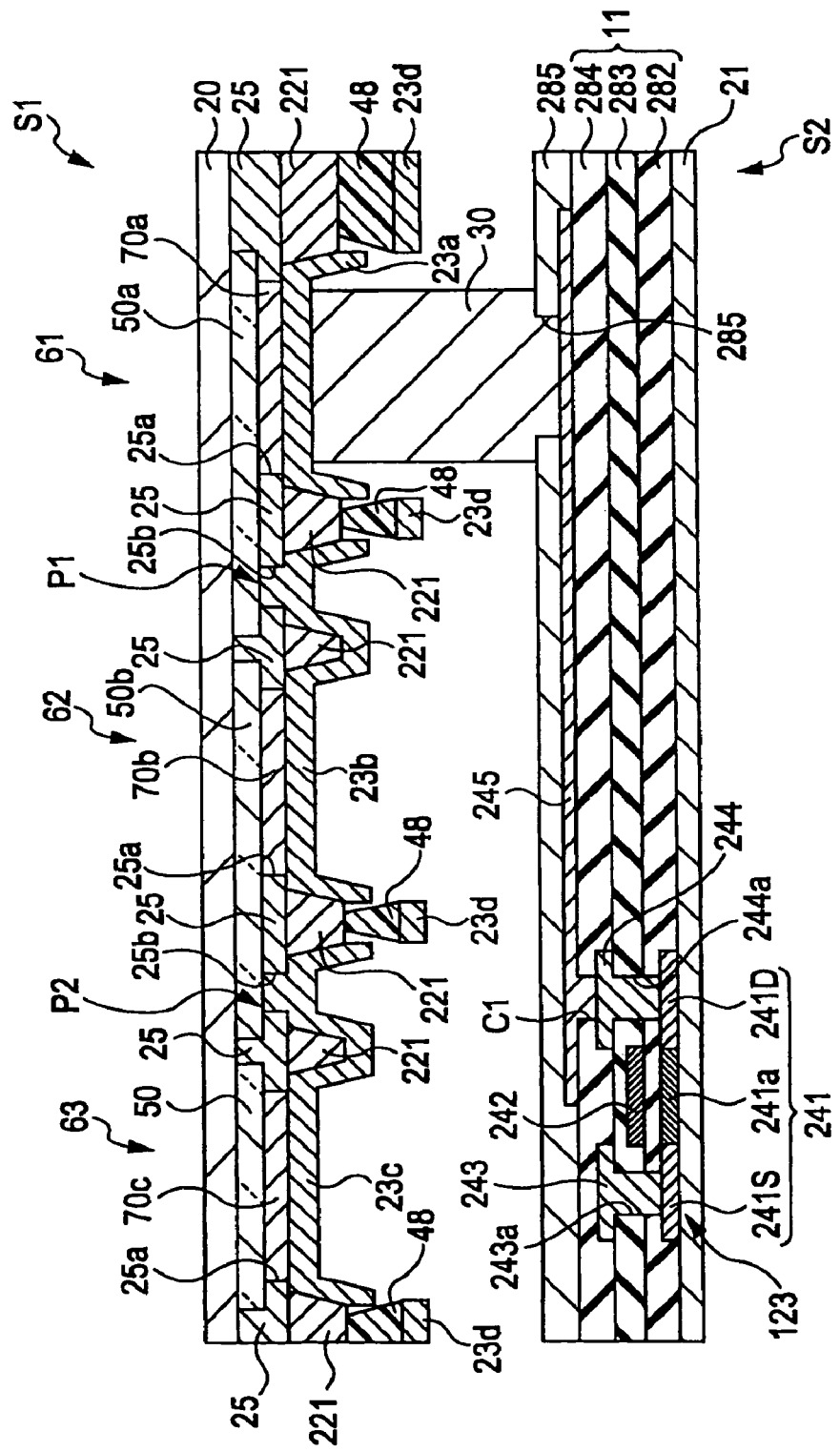
FIG. 5 is a cross-sectional view taken along the V-V line of FIG. 4.

Next, the cross-sectional structure of the pixel region X will be described in detail with reference to FIG. 5. FIG. 5 is a cross-sectional view taken along the V-V line of FIG. 4. As shown in FIG. 5, the organic EL device 1 of the present embodiment includes a first substrate S1 in which the organic EL elements 61, 62, and 63 are formed, a second substrate S2 in which the driving TFT 123 for causing the organic EL elements 61, 62, and 63 to emit light is formed, and a conductive connection member 30 which electrically connects the first and second substrates S1 and S2. As the conductive connection member 30, silver paste can be used, for example. In the second substrate S2, the switching TFT 112, the holding capacitor 113, the scanning lines 101, the signal lines 102, and the power lines 103, which are shown in FIG. 1, are formed in addition to the driving TFT 123. Hereinafter, the construction of the second substrate S2 and first substrate S1 will be sequentially described.

Second Substrate

The driving TFT 123 and the like of the second substrate S2 are formed on a substrate 21. As the substrate 21, a transparent or half-transparent substrate or an opaque substrate is adopted. As the transparent or half-transparent substrate, a glass substrate, quartz substrate, resin substrate (plastic or plastic film), and the like are exemplified. In particular, a glass substrate is preferably used. Moreover, the organic EL device 1 of the present embodiment is a so-called top-emission-type organic EL device which extracts the emitted light obtained from each pixel region X from the opposite side to the second substrate S2 in which the driving TFT 123 and the like are formed. Therefore, an opaque substrate may be used.

On the substrate 21, a driving circuit section is formed, which includes the driving TFT 123 for driving the pixel electrode 23 (electrode 23a). The driving TFT 123 is exemplified to describe the construction of the driving circuit section. On the surface of the substrate 21, a base protecting layer (not shown) which mainly consists of $SiO_2$ is formed as a base, on which a silicon layer 241 is formed. On the surface of the silicon layer 241, a gate insulating layer 282 including at least any one of $SiO_2$ and SiN is formed.

In the silicon layer 241, a region which is overlapped with a gate electrode 242 with the gate insulating layer 282 interposed therebetween is set to a channel region 241a. On the other hand, on the surface of the gate insulating layer 282 which covers the silicon layer 241 and on which the gate electrode 242 is formed, a first interlayer insulating layer 283 which mainly consists of $SiO_2$ is formed.

In the silicon layer 241, a source region 241S is provided in the source side of the channel region 241a, and a drain region 241D is provided in the drain side of the channel region 241a. Preferably, in the source side of the channel region 241a, a low concentration source region and high concentration source region are formed, and in the drain side of the channel region 241a, a low concentration drain region and high concentration drain region are formed, thereby forming a so-called LDD (lightly doped drain) structure.

The source region 241S is connected to a source electrode 243 through a contact hole 243a which is opened through the gate insulating layer 282 and the first interlayer insulating layer 283. The source electrode 243 is constructed as a portion of the above-described power line 103 (refer to FIG. 1) (which extends in the direction perpendicular to the paper surface in the position of the source electrode 243 in FIG. 5). On the other hand, the drain region 241D is connected to a drain electrode 244 composed of the same layer as the source electrode 243 through a contact hole 244a which is opened through the gate insulating layer 282 and the first interlayer insulating layer 283.

The upper layer of the first interlayer insulating layer 283 in which the source electrode 243 and the drain electrode 244 are formed is covered by a second interlayer insulating layer 284 which mainly consists of acrylic resin. The second interlayer insulating layer 284 can be formed of SiN, $SiO_2$, or the like except for an acrylic insulating film. On the surface of the second interlayer insulating layer 284, an electrode 245 is formed. The electrode 245 is connected to the drain electrode 244 through a contact hole C1 provided in the second interlayer insulating layer 284. In other words, the electrode 245 is connected to the drain region 241D of the silicon layer 241 through the drain electrode 244.

Across the overall surface of the electrode 245 and the second interlayer insulating layer 284, an insulating layer 285 composed of $SiO_2$ is formed. In the insulating layer 285, an opening section 285a is formed at a predetermined position on the electrode 245. The opening section 285a is set to a pad section for connecting the conductive connection member 30. The above-described components from the substrate protecting film (not shown) formed on the substrate 21 to the second interlayer insulating layer 284 compose a circuit section 11. Moreover, the switching TFT 112 provided in the driving circuit section is set to have the same structure as the driving TFT 123. The TFT (for a driving circuit) included in the scanning line driving circuit 80 and the checking circuit 90, that is, an N-channel-type or P-channel-type TFT forming an inverter included in the shift register among the driving circuits is set to have the same structure as the driving TFT 123 except for when the TFT is connected to the electrode 23a.

First Substrate

The organic EL elements 61, 62, and 63 of the first substrate are formed on a substrate 20. As the first substrate 20, a transparent or half-transparent substrate is used. For example, a glass substrate, a quartz substrate, a resin substrate (plastic or plastic film) and the like are exemplified. In particular, the glass substrate is preferably used. The organic EL elements 61, 62, and 63 are formed on the first substrate S1. However, since the organic EL device 1 is a so-called top-emission-type organic EL device, the first substrate S1 is mounted with the substrate 20 being disposed at the upper side (display surface side), as shown in FIG. 5. Hereinafter, the positional relationship between the respective components in a state where the substrate 20 is mounted so as to be disposed at the upper side will be described as shown in FIG. 5.

The lower surface of the substrate 20 is covered by the transparent electrodes 50a and 50b, the common electrode 50, a lyophilic control layer 25 which mainly consists of a lyophilic insulating material such as $SiO_2$, and an organic bank layer 221 composed of an organic insulating material such as acryl or polyimide. Moreover, the 'lyophilicity' of the lyophilic control layer 25 in the present embodiment means that the lyophilic control layer is more lyophilic than a material such as acryl or polyimide forming the organic bank layer 221.

In the lyophilic control layer 25, a plurality of opening sections 25a and 25b are formed. The opening sections 25a are formed in the position where the organic EL elements 61, 62, and 63 should be formed. The opening sections 25b are formed in the connection position between the transparent electrode 50a of the organic EL element 61 and the electrode 23b of the organic EL element 62, which is shown by reference numeral P1 in FIG. 4, and in the connection position between the transparent electrode 50b of the organic EL element 62 and the electrode 23*c* of the organic EL element 63, which is shown by reference numeral P2. In the boundary between the respective display regions (pixel regions) including the organic EL elements 61, 62, and 63, a black matrix (BM) (not shown) in which metallic chrome is film-formed by sputtering or the like is formed to be positioned between the organic bank layer 221 and the lyophilic control layer 25.

At the lower side of the transparent electrodes 50*a* and 50*b* and the common electrode 50, the light emitting films 70*a*, 70*b*, and 70*c* are provided. The light emitting films 70*a*, 70*b*, and 70*c* are used to emit respective colors of light to the display regions R, G, and B shown in FIG. 2. As a material for forming the light emitting films 70*a*, 70*b*, and 70*c*, a well-known light emitting material can be used, which can emit fluorescent light or phosphor light.

Specifically, a (poly)fluorene derivative (PF), a (poly)paraphenylenevinylene derivative (PPV), a polyphenylene derivative (PP), (poly)para-phenylene derivative (PPP), polyvinyl carbazole (PVK), a polythiophene derivative, a polysilane material such as polymethyl phenyl silane (PMPS), and the like are preferably used. Further, a high-molecular material such as a perylene-based pigment, a coumarin-based pigment, a rhodamine-based pigment, or the like, is doped with a low-molecular material such as rubrene, perylene, 9 and 10-diphenyl anthracene, tetraphenyl butadiene, Nile Red, coumarin 6, quinacridone, or the like. Then, the doped material can be used as a forming material. Instead of the high-molecular materials, well-known low-molecular materials can be used.

On such light emitting films 70*a*, 70*b*, and 70*c* (between the light emitting films 70*a*, 70*b*, and 70*c* and the transparent electrodes and common electrode 50*a*, 50*b*, and 50), if needed, a hole injecting layer as a carrier injecting layer or a hole transporting layer as a carrier transporting layer may be formed, and an electron injecting layer or electron transporting layer may be formed therebelow. When a hole transporting layer or hole injecting layer is formed, a polythiophene derivative, a polypyrrole derivative, or a doped body thereof is used as a forming material thereof. Specifically, dispersion liquid of 3, 4-polyethylenedioxy thiophene/polystyrene sulfonate (PEDOT/PSS), that is, dispersion liquid in which the 3, 4-polyethylenedioxy thiophene is dispersed into the polystyrene sulfonate as a dispersion medium and is further dispersed into water can be used.

The above-described transparent electrodes 50*a* and 50*b* and the common electrode 50 are formed of a transparent conductive material, because the organic EL device 1 of the present embodiment is a so-called top-emission-type organic EL device. As a transparent conductive material, ITO is preferable. In addition to that, however, an indium oxide and zinc oxide amorphous transparent conductive film (indium zinc oxide: IZO) (trademark) (made by Idemitsu Kosan Co., Ltd.) or the like can be used. In the present embodiment, it is assumed that ITO is used.

At the lower side of the organic bank layer 221, a resist layer 48 is formed in a reversed-tapered shape. However, the resist layer is not formed at the lower side of the organic bank layer 48 formed between the opening section 25*a* and the opening section 25*b* within the pixel region, the opening section 25*a* being formed at the position where the light emitting film of the organic EL element 63 should be formed and the opening section 25*b* being formed at the connection position shown by reference numeral P2. Similarly, the resist layer 48 is not formed in the lower side of the organic bank layer 221 formed between the opening section 25*a* and the opening section 25*b*, the opening section 25*a* being formed in the position where the-light emitting film of the organic EL element 62 should be formed and the opening section 25*b* being formed in the connection position shown by reference numeral P1.

The resist layer 48 not only electrically separates the electrode 23*a* forming a portion of the organic EL element 61, the electrode 23*b* forming a portion of the organic EL element 62, and the electrode 23*c* forming a portion of the organic EL element 63, but also electrically separates them from a conductive layer 23*d*. The resist layer 48 can be formed of resist. Even though detailed descriptions will be made below, the electrodes 23*a*, 23*b*, and 23*c* and the conductive layer 23*d* are formed by the same process such as sputtering or the like. Therefore, if the reversed-tapered resist layer 48 is not present, the electrodes 23*a*, 23*b*, and 23*c* and the conductive layer 23*d* can be electrically separated. Accordingly, the resist layer 48 is formed.

In other words, at the lower side of the organic bank layer 221 provided so as to come in contact with the electrodes 23*a*, 23*b*, and 23*c* and the conductive layer 23*d*, the resist layer 48 having a tapered shape which is reverse to the tapered shape of the organic bank layer 221 is further provided to separate the electrodes 23*a*, 23*b*, and 23*d* and the conductive layer 23*d* from each other. Accordingly, the electrodes 23*a*, 23*b*, and 23*c* and the conductive layer 23*d* can be formed in the same process. Further, the electrodes 23*a*, 23*b*, and 23*c* and the conductive layer 23*d* formed in the same process can be electrically separated reliably from each other.

The resist layer 48 is not formed at the lower side of the organic bank layer 221 formed between the opening section 25*a* and the opening section 25*b*, the opening section 25*a* being formed at the position where the light emitting film of the organic EL element 63 should be formed and the opening section 25*b* being formed in the connection position shown by reference numeral P2. Therefore, the electrode 23*c* including a portion of the organic EL element 63 is formed across the organic bank layer 221 up to the lower side of the transparent electrode 50*b* including a portion of the organic EL element 62. In the connection position shown by reference numeral P2, the opening section 25*b* is formed, and the electrode 23*c* is also formed inside the opening section 25*b*. Therefore, the electrode 23*c* including a portion of the organic EL element 63 and the transparent electrode 50*b* forming a portion of the organic EL element 62 are electrically connected to each other.

Similarly, the resist layer 48 is not formed at the lower side of the organic bank layer 221 formed between the opening section 25*a* and the opening section 25*b*, the opening section 25*a* being formed in the position where the light emitting film of the organic EL element 62 should be formed and the opening section 25*b* being formed in the connection position shown by reference numeral P1. Therefore, the electrode 23*b* forming a portion of the organic EL element 62 is formed across the organic bank layer 221 up to the lower side of the transparent electrode 50*a* including a portion of the organic EL element 61. In the connection position shown by reference numeral P1, the opening section 25*b* is formed, and the electrode 23*b* is also formed inside the opening section 25*b*. Therefore, the electrode 23*b* including a portion of the organic EL element 62 and the transparent electrode 50*a* including a portion of the organic EL element 61 are electrically connected to each other. Moreover, the resist layer 48 functions as a spacer when the first and second substrate S1 and S2 are bonded to each other.

The electrodes 23*a*, 23*b*, and 23*c* can be formed of a material such as metal or alloy without any limitation, if the material is a chemically-stable conductive material. Specifically, aluminum (Al) is preferably used. The thickness of the electrodes 23a, 23b, and 23c is preferably in the range of 100 nm to 500 nm. Further, in order to alleviate such problems as deterioration and alteration of the light emitting layers 70a, 70b, and 70c, it is preferable that the electrodes 23a, 23b, and 23c have a thickness of about 200 nm. Moreover, in the present embodiment, the electrodes 23a, 23b, and 23c are formed of Au.

Among the electrodes 23a, 23b, and 23c, the electrode 23a is connected to the conductive connection member 30. As shown in FIG. 5, the second substrate S2 is disposed so as to cover the organic EL elements 61, 62, and 63 formed in the first substrate S, and serves as a sealing substrate which seals the organic EL elements 61, 62, and 63 formed in the first substrate S1. Moreover, even though not being shown, sealing resin composed of thermosetting resin or violet curing resin is coated on the circumferential edge of the rear surface (the surface where the organic EL elements 61, 62, and 63 are formed) of the substrate 20. Due to the sealing resin, the first and second substrates S1 and S2 are joined.

In such a construction, if the driving TFT 123 shown in FIG. 5 is turned on, an electric current flows into the drain electrode 244 from the source electrode 243 through the channel region 241a of the driving TFT 123. The current is supplied to the electrode 23a formed in the first substrate S1 through the electrode 245 and the conductive connection member 30 formed in the second substrate S2, and is further supplied to the light emitting film 70a of the organic EL element 61 from the electrode 23a (the pixel electrode 23). Accordingly, in the light emitting film 70a, light emission of the luminance according to the current level or the amount of supplied current is performed.

The current flowing into the light emitting film 70a flows into the light emitting film 70b through the transparent electrode 50a and the electrode 23b of the organic EL element 62, and thus, light emission of the luminance according to the supplied current is performed in the light emitting film 70b. The current flowing into the light emitting film 70b flows into the light emitting film 70c through the transparent electrode 50b and the electrode 23c of the organic EL element 63, and thus light emission of the luminance according to the supplied current is performed in the light emitting film 70c. The current flowing into the light emitting film 70c is recovered by a power supply (not shown) through the common electrode 50. As such, in the present embodiment, the light emission of the organic EL elements 61, 62, and 63 connected in series within the pixel region is controlled by the driving TFT 123 provided within the pixel region.

Manufacturing Process of Organic EL Device

Hereinafter, a method of manufacturing an organic EL device having the above-described construction will be described. As described above, the organic EL device is constructed with the first and second substrates S1 and S2 bonded to each other. A manufacturing process is roughly divided into a manufacturing process of the second substrate S2, a manufacturing process of the first substrate S1, and a bonding process of the first and second substrates S1 and S2. The respective processes will be sequentially described.

Manufacturing Process of Second Substrate S2

FIGS. 6 and 7 are process diagrams showing an example of a manufacturing process of the second substrate S2 including a portion of the organic EL device according to an embodiment of the present invention. First, on the substrate 21, the base protecting layer which mainly consists of $SiO_2$ is formed. The formation of the base protecting layer can be performed by PE-CVD, with silane and oxygen ($O_2$) being used as a reactive gas. Moreover, tetraethoxysilane (TEOS: $Si(OC_2H_5)_4$) and ozone ($O_3$) can be used as a reactive gas. Further, instead of PE-CVD, AP-CVD or LP-CVD can be used.

On the surface of the base protecting layer, a silicon film composed of polycrystalline silicon (p-Si) is formed. Specifically, on the overall surface of the base protecting layer, an amorphous silicon (a-Si) film is first formed. The formation of the amorphous silicon (a-Si) film can be performed by PE-CVD or the like, with silane being used as a reactive gas. Next, excimer laser (with a wavelength of 308 nm) is irradiated on the a-Si film, and a-Si is heated until it is melted. The melted a-Si is cooled to be recrystallized, so that p-Si can be formed at a low temperature.

Figure 6A:
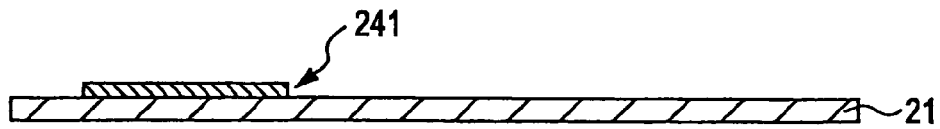
FIG. 6A-6F is a process diagram showing an example of a manufacturing process of a second substrate S2 made of the portion the organic EL device according to an exemplified embodiment of the invention.
Figure 6B:
Figure 6C:

The p-Si film is patterned in a predetermined shape by using a photolithographic technique. Then, as shown in FIG. 6A, an island-shaped silicon layer 241 composed of p-Si is accordingly formed on the substrate 21. When the formation of the silicon layer 241 is completed, boron (B) ion or the like is implanted in the silicon layer 21, as shown in FIG. 6B. Next, as shown in FIG. 6C, the gate insulating layer 282 is formed on the surface of the silicon layer 241. The formation of the gate insulating layer is performed as follows: the substrate 21 is put into a high-temperature oxidative atmosphere and the surface of the silicon layer 241 is thermally-oxidized. Moreover, instead of this, an oxidized silicon film may be formed by LP-CVD or the like.

Figure 6D:

As shown in FIG. 6D, the gate electrode 242 composed of p-Si is formed on the surface of the gate insulating layer 282. Specifically, a p-Si film is first formed on the overall surface of the gate insulating layer 282. Next, if the p-Si film is patterned by using a photolithographic technique, the gate electrode 242 is formed on the surface of the gate insulating layer 282. Then, the source region 241S and the drain region 241D are formed in the silicon layer 241. Specifically, with the gate electrode 242 set to a mask, highly concentrated phosphorus (P) ion is implanted in the silicon layer 241. Moreover, after the highly concentrated phosphorus ion is implanted, annealing is performed so as to recover the crystallinity of the silicon. Then, the source region 241S and the drain region 241D are formed in a portion to which the highly concentrated phosphorus ion is introduced, and the channel region 241a is formed in a portion to which the highly concentrated phosphorus ion is not introduced.

Figure 6E:
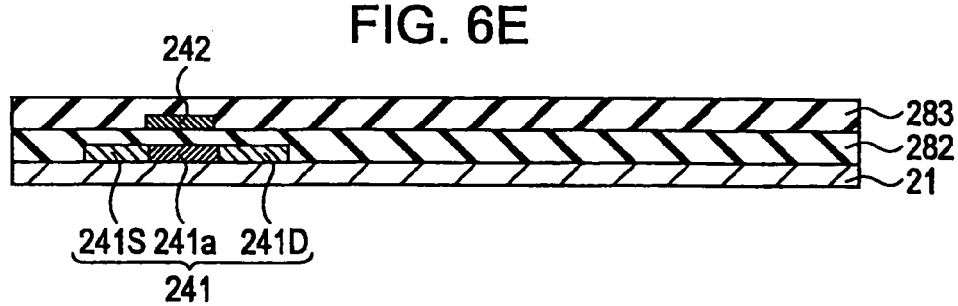
Figure 6F:
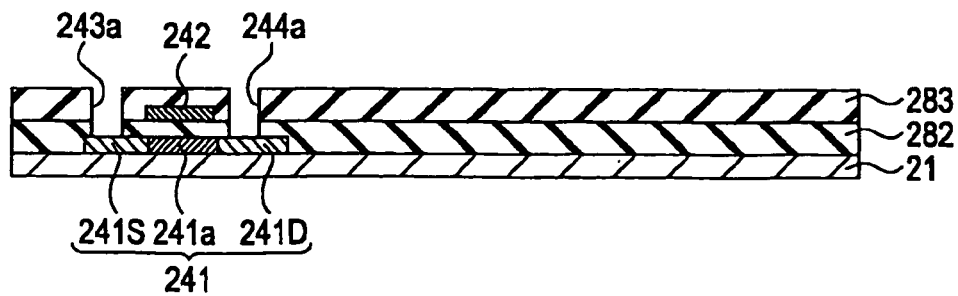

As shown in FIG. 6E, the first interlayer insulating layer 283 composed of oxidized silicon is formed so as to cover the gate insulating layer 282 and the gate electrode 242. The formation of the oxidized silicon film can be performed by PE-CVD or the like. Next, the contact hole 243a is formed at the upper side of the source region 241S of the silicon layer 241, and the contact hole 244a is formed in the upper side of the drain region 241D (refer to FIG. 6F). The formation of the contact holes 243a and 244a can be performed by a photolithographic technique and dry etching. In the dry etching, reactive ion etching is used, and $CF_4$ or the like is preferably used as an etchant.

Figure 7A:
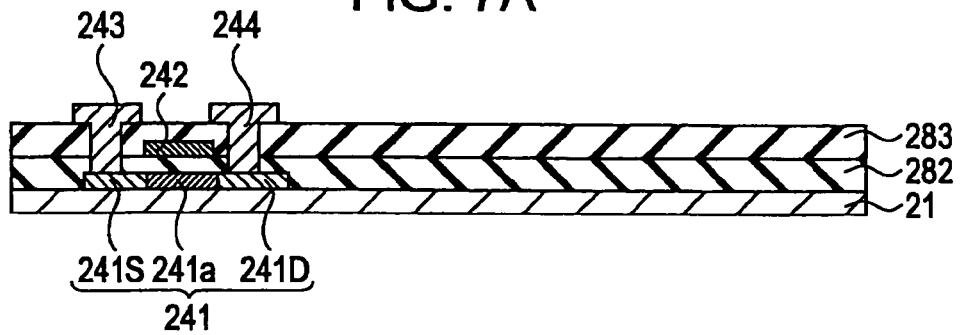
FIG. 7A-7D is a process diagram showing an example of a manufacturing process of the second substrate S2 made of the portion the organic EL device according to an embodiment of the invention.
Figure 7B:
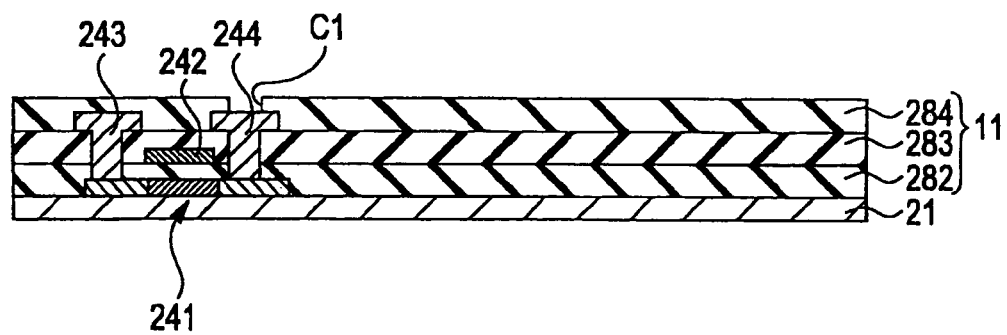
Figure 7C:
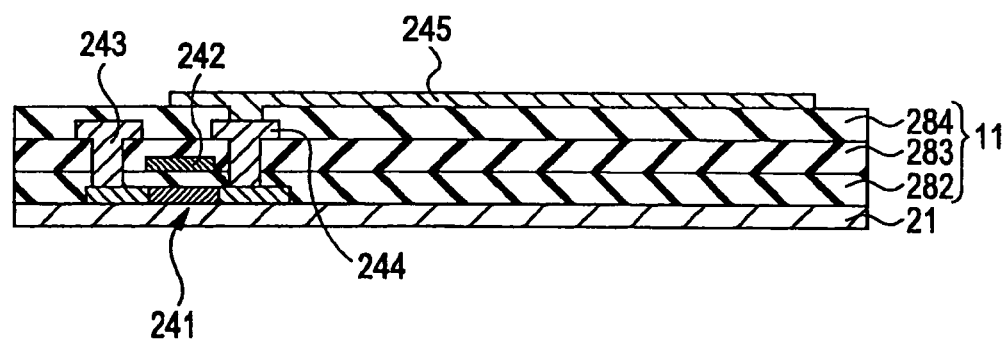
Figure 7D:
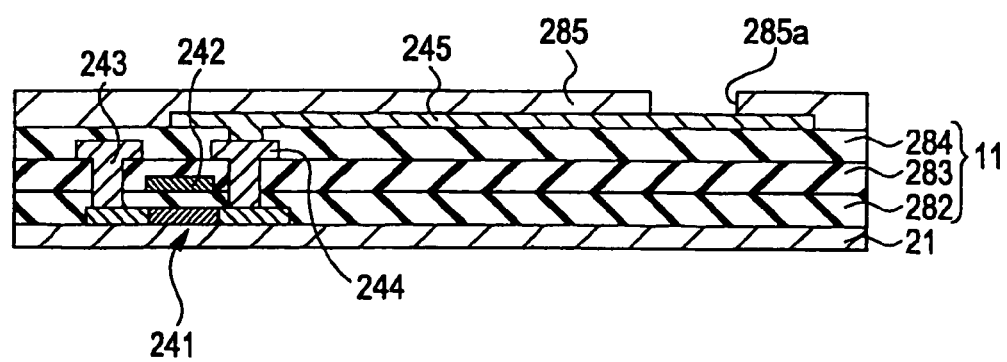

When the above-described processes are completed, the source electrode 243 and the drain electrode 244, which are made of metallic material such Al or Cu, are formed on the surface of the first interlayer insulating layer 283 (refer to FIG. 7A). The source electrode 243 and the drain electrode 244 are formed by performing a sputtering method, with patterned resist being set to a mask. At this time, a metallic material is also filled in the contact holes 243a and 243b.

The second interlayer insulating layer 284 composed of oxidized silicon is formed so as to cover the source electrode 243 and drain electrode 244 as well as the first interlayer insulating layer 283. The formation of the oxidized silicon film can be performed by PE-CVD or the like, similar to the case of the first interlayer insulating layer 283. Next, the contact hole C1 is formed in the upper side of the drain electrode 244. The formation of the contact hole C1 can be performed by a photolithographic technique and dry etching, similar to the case of the first interlayer insulating layer 283. Accordingly, the circuit section 11 is formed.

When the above-described processes are completed, the electrode 245 is formed on the second interlayer insulating layer 284. Specifically, a metallic film composed of a metallic material such as Al or Cu is first formed on the overall surface of the second interlayer 284. The formation of the metallic film is performed by a vacuum evaporation method or sputtering method. At this time, a forming material of metallic film is also filled in the contact hole C1. Next, the metallic film is patterned by using a photolithographic technique and dry etching. Accordingly, the wiring lines 245 are formed on the surface of the second interlayer insulating layer 284 (refer to FIG. 7C).

Next, the insulating layer 285 is formed on the second interlayer insulating layer 284 and the electrode 245. Specifically, an insulating layer composed of, for example, $SiO_2$ is first formed on the overall surface of the second interlayer insulating layer 284 and the electrode 245. The formation of the insulating layer is performed by a sputtering method. Next, the insulating film is patterned by using a photolithographic technique and dry etching, and the opening section 285a is formed on a predetermined position of the electrode 245. Accordingly, the insulating layer 285, in which the opening section 285a is formed at a predetermined position of the electrode 245, is formed (refer to FIG. 7D)

Manufacturing Process of First Substrate S1

FIGS. 8 and 13 are process diagrams showing an example of a manufacturing process of the first substrate S1 including a portion of the organic EL device according to an embodiment of the present invention. First, on the substrate 20, the transparent electrodes 50a and 50b and the common electrode 50, which are composed of ITO, are formed. Specifically, an ITO film is first formed on the overall surface of the substrate 20. The formation of the ITO film is performed by a vacuum evaporation method. The vacuum evaporation method is where an ITO sintered body is heated in a vacuum so as to evaporate the ITO and is then deposited on the surface of the substrate 20. Next, the ITO film is patterned by using a photolithographic technique and dry etching. Accordingly, the transparent electrodes 50a and 50b and the common electrode 50 are formed on the surface of the substrate (refer to FIG. 8A).

On the substrate 20 excluding the upper portions of the transparent electrodes 50a and 50b and the electrode 50 where the light emitting films 70a, 70b, and 70c should be formed, the lyophilic control layer 25 which mainly consists of, for example, $SiO_2$ is formed. Specifically, a lyophilic film which mainly consists of a lyophilic material such as $SiO_2$ is first formed on the overall surface of the transparent electrodes 50a and 50b and the common electrode 50 as well as the substrate 20. The formation of the lyophilic film can be performed by PE-CVD or the like, with silane being used as a reactive gas.

At the time when the lyophilic control layer 25 is formed, oxygen plasma processing and fluorine plasma processing may be performed. Accordingly, the lyophilicity of the lyophilic control layer 25 with respect to a polar liquid can be improved.

The opening sections 25a are formed in the positions where the light emitting films 70a, 70b, and 70c should be formed by using a photolithographic technique or dry etching. Further, at the position (where reference numeral P1 is attached) which should become the connection position between the transparent electrode 50a of the organic EL element 61 and the electrode 23b of the organic EL element 62. At the position (where reference numeral P2 is attached) which should become the connection position between the transparent electrode 50b of the organic EL element 62 and the electrode 23c of the organic EL element 63, the opening sections 25b are formed (refer to FIG. 8B). After that, in the space of a region which becomes the pixel region, the BM (not shown) is formed. Specifically, on the convex portion of the lyophilic control layer 25, metallic chrome is film-formed by a sputtering method.

Figure 8A:
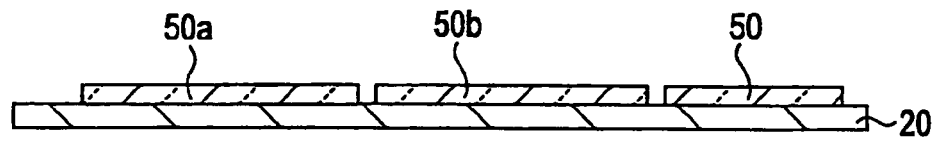
FIG. 8A-8D is a process diagram showing an example of a manufacturing process of a first substrate S1 made of the portion the organic EL device according to an exemplified embodiment of the invention.
Figure 8B:
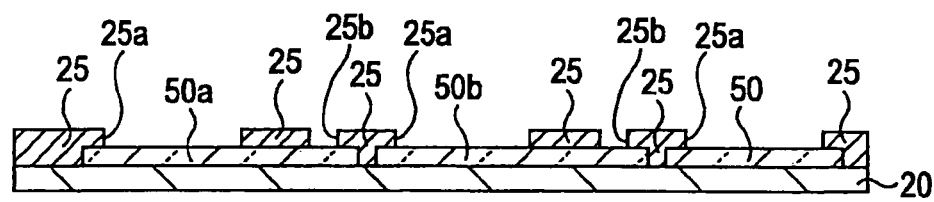
Figure 8C:
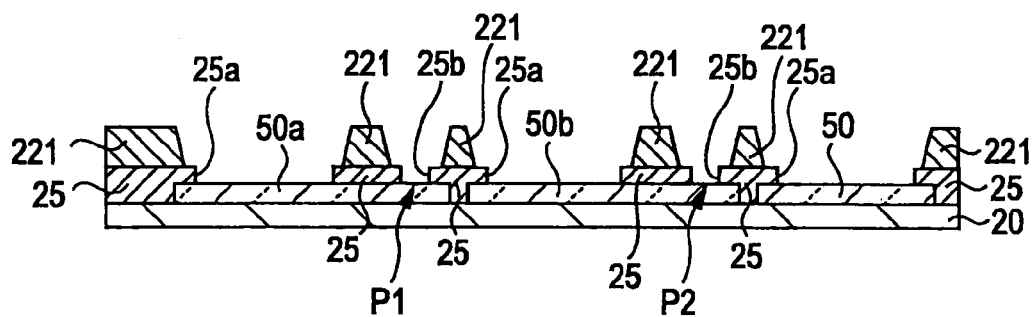

As shown in FIG. 8C, the organic bank layer 221 is formed on a predetermined position of the lyophilic control layer 25. Specifically, the formation of the organic bank layer 221 is performed as follows: resist such as acrylic resin or polyimide resin is melted in a solvent and the melted resist is coated by various coat methods such as a spin coat method, a dip coat method, and the like, thereby forming an organic layer. Preferably, the constituent material of the organic layer is such a material that is easily patterned by etching, without being melted into a solvent which is used when the light emitting films 70a, 70b, and 70c to be described below are formed. Subsequently, the organic layer is patterned by using a photolithographic technique and etching, so that the organic bank layer 221 is formed on a predetermined position of the lyophilic control layer 25.

Figure 8D:
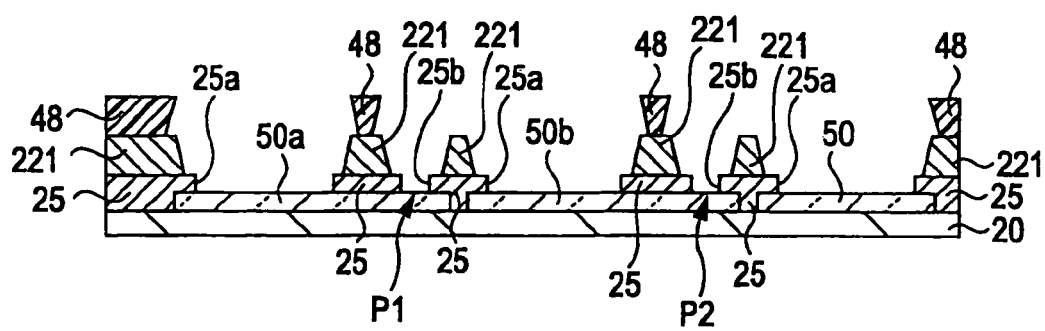

As shown in FIG. 8D, the resist layer 48 having a tapered shape which is reverse to the tapered shape of the organic bank layer 221 is formed at a predetermined position of the organic bank layer 221. Specifically, the formation of the resist layer 48 is performed as follows: resist is melted in a solvent and the melted resist is coated by various coat method such as a spin coat method, a dip coat method, and the like, thereby forming the resist layer. Moreover, the constituent material of the resist layer is not be limited, if the material is easily patterned by an etchant (which does not melt the organic bank layer 221) which is used at the time of etching, without being melted in a solvent which is used when the light emitting films 70a, 70b, and 70c are formed. When the resist layer is formed, patterning is performed by using the etchant. Accordingly, the reversed-tapered resist layer 48 is formed at a predetermined position of the organic bank layer 221.

On the organic bank layer 221 formed between the opening section 25a formed at the position where the light emitting film of the organic EL element 63 should be formed and the opening section 25b formed at the connection position where reference numeral P2 is attached, the resist layer 48 is not formed. Similarly, on the organic bank layer 221 formed between the opening section 25a formed at the position where the light emitting film of the organic EL element 62 should be formed and the opening section 25b formed at the connection position where reference numeral P1 is attached, the resist layer 48 is not formed.

When the above-described processes are completed, the surfaces of the transparent electrodes 50a and 50b, the lyophilic control layer 25, the common electrode 50, the organic bank layer 221, and the resist layer 48 are subjected to plasma processing by using oxygen plasma or fluorine plasma. The plasma processing focuses on the activation of the surfaces of the transparent electrodes 50a and 50b and the common electrode 50 as well as the lyophilization/repellency treatment of the surfaces of the transparent electrodes 50a and 50b, the common electrode 50, and the organic bank layer 221. In particular, the activation of the surfaces of the transparent electrodes 50a and 50b and the common electrode 50 is mainly focused on cleaning the surfaces of the transparent electrodes 50a and 50b and the common electrode 50 and adjusting a work function.

As the preprocessing of the plasma processing, the substrate 20 is preheated at a predetermined temperature. The predetermined temperature is in the range of about 70 to 80° C. Next, focused on the activation of the surfaces of the transparent electrodes 50a and 50b and the common electrode 50 and the lyophilization of the surfaces of the transparent electrodes 50a and 50b, the common electrode 50, and the organic bank layer 221, first plasma processing is performed. In the first plasma processing, plasma processing ($O_2$ plasma processing) with an oxygen gas set to a processing gas is performed at atmospheric pressure and under vacuum. By the first plasma processing, the electrode surfaces of the transparent electrodes 50a and 50b and the common electrode 50 are cleaned, and the adjustment of the work function is performed. Further, on the electrode surfaces of the transparent electrodes 50a and 50b and the common electrode 50 and the surface of the organic bank layer 221, hydroxyl is introduced, so that the lyophilicity with respect to polar liquid is applied.

Focused on the repellency treatment of the surface of the organic bank layer 221, second plasma processing is performed. In the second plasma processing, plasma processing ($CF_4$ plasma processing) with a $CF_4$ gas set to a processing gas is performed at atmosphere pressure and under vacuum. As a processing gas, another fluorocarbon-based gas can be used, without being limited to a $CF_4$ gas. By the second plasma processing, fluorine is introduced onto the upper surface of the organic bank layer 221, so that the repellency is applied. Moreover, organic matters such as polyimide resin forming the organic bank layer 221 are irradiated with fluorocarbon in a plasma state so as to be easily fluorinated. Further, in the present embodiment, the $O_2$ plasma processing is performed as the preprocess of the $CF_4$ plasma processing. Therefore, the organic bank layer 221 can be easily fluorinated. Finally, the substrate 20 subjected to the plasma processing is cooled down to the control temperature for the next process.

Figure 13A:
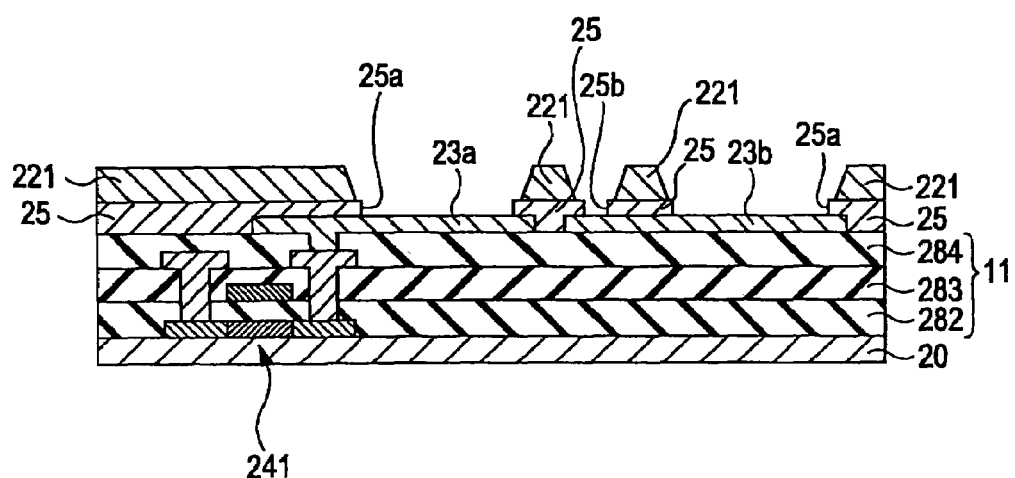
FIG. 13A-13B is a process diagram showing an example of the method of manufacturing the organic EL device according to another embodiment of the invention.

When the above-described processes are completed, the light emitting films 70a, 70b, and 70c are respectively formed on the surfaces of the transparent electrodes 50a and 50b and the common electrode 50, inside the openings 25a (refer to FIG. 13A). Moreover, prior to the formation of the light emitting films 70a, 70b, and 70c, hole injecting/transporting layers are formed on the respective surfaces of the transparent electrodes 50a and 50b and the common electrode 50. On the hole injecting/transporting layers, the light emitting films 70a, 70b, and 70c are preferably formed. The formation process of the light emitting films 70a, 70b, and 70c (as well as the formation process of the hole injecting/transporting layer) is preferably performed in an atmosphere without water and oxygen. For example, the formation process can be performed in an inert gas atmosphere such as nitrogen or argon. Afterwards, such a case will be exemplified and described where the light emitting films 70a, 70b, and 70c are formed after the hole injecting/transporting layer is formed.

The formation of the hole injecting/transporting layer and the light emitting films 70a, 70b, and 70c is performed by discharging droplets of liquid material including forming materials thereof toward the transparent electrodes 50a and 50b and the common electrode 50. In discharging the liquid material, a droplet discharge device is used. First, the hole injecting/transporting layer is formed on each surface of the transparent electrodes 50a and 50b and the common electrode 50 by using the droplet discharge device. Specifically, the droplets of liquid material in which a forming material of the hole injecting/transporting layer is melted in a polar solvent are discharged onto the surfaces of the transparent electrodes 50a and 50b and the common electrode 50. The discharged liquid material spreads onto the inner circumferential surface of the opening section 25a along the respective surfaces of the transparent electrode 50a and 50b and the common electrode 50 which are subjected to the lyophilization treatment.

Next, drying process is performed by heating or light-irradiation so as to evaporate the polar solvent contained in the liquid material. On the transparent electrodes 50a and 50b and the common electrode 50, the evaporation rate of the polar solvent becomes substantially uniform, and the forming material of the hole injecting/transporting layer is concentrated uniformly. Accordingly, the hole injecting/transporting layer having a uniform thickness is formed on the electrode surface of the transparent electrodes 50a and 50b and the common electrode 50. When the hole injecting/transporting layer with a desired thickness is not obtained by one-round of the discharging process by the droplet discharge device and the drying process, the discharging process and the drying process may be repeated a plurality of times.

Subsequently, on the surface of the hole injecting/transporting layer, the light emitting films 70a, 70b, and 70c are formed. Moreover, prior to this, the hole injecting or transporting layer is surface-modified. The formation of the light emitting films 70a, 70b, and 70c is performed as follows: the droplets of liquid material in which the forming material of the light emitting films 70a, 70b, and 70c is melted in a non-polar solvent is discharged onto the surface of the hole injecting/transporting layer by using the droplet discharge device. The discharged liquid material spreads in a layer shape up to the side surface of the organic bank layer 221 along the surface of the hole injecting/transporting layer. Since the upper surface and side surface of the organic bank layer 221 are subjected to the repellency treatment, the liquid material for forming the light emitting film 70a does not flow in the forming region of the light emitting film 70b across the organic bank layer 221, in one pixel region X. Further, it becomes unlikely that the liquid discharged in one pixel region X flows in another pixel region X across the organic bank layer 221.

Similar to the case of the hole injecting/transporting layer, the discharged liquid material is dried (and heated), thereby forming the light emitting films 70a, 70b, and 70c. As such, the red (R), green (G), and blue (B) light emitting films 70a, 70b, and 70c are formed in each pixel region X. In the present embodiment, even though the light emitting films 70a, 70b, and 70c are formed of a high-molecular material, the light emitting films 70a, 70b, and 70c may be formed of a low-molecular material by using an evaporation method.

Figure 13B:
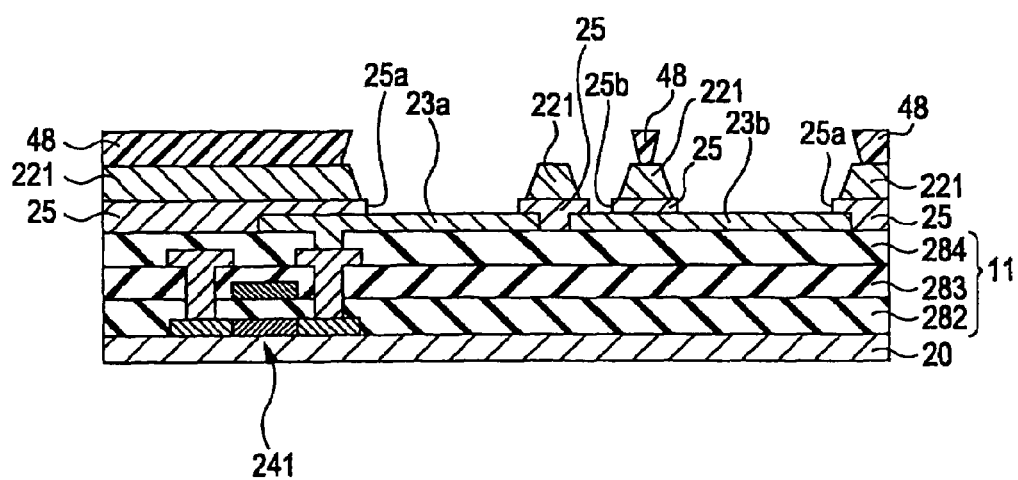

When the above-described processes are completed, the electrode 23a is formed on the upper portion of the light emitting film 70a, the electrode 23b is formed on the upper portion of the light emitting film 70b, and the electrode 23c is formed on the upper portion of the light emitting film 70c (refer to FIG. 13B). Specifically, LiF and Al are laminated in the above-mentioned order by an evaporation method or the like, thereby forming a laminated film (LiF/Al). The laminated film is formed on the upper surface of the light emitting films 70a, 70b, and 70c and the resist layer 48, but the resist layer 48 is formed in a reversed-tapered shape. Therefore, the laminated film formed on a barrier layer is insulated from the laminated film formed on the other portions (the light emitting films 70a, 70b, and 70c). Accordingly, the electrode 23a is formed on the upper portion of the light emitting film 70a, the electrode 23b is formed on the upper portion of the light emitting film 70b, and the electrode 23c is formed on the upper portion of the light emitting film 70c. The laminated film on the resist layer 48 becomes the conductive layer 23d, but the conductive layer 23d cannot be used for driving the organic EL device.

Figure 9A:
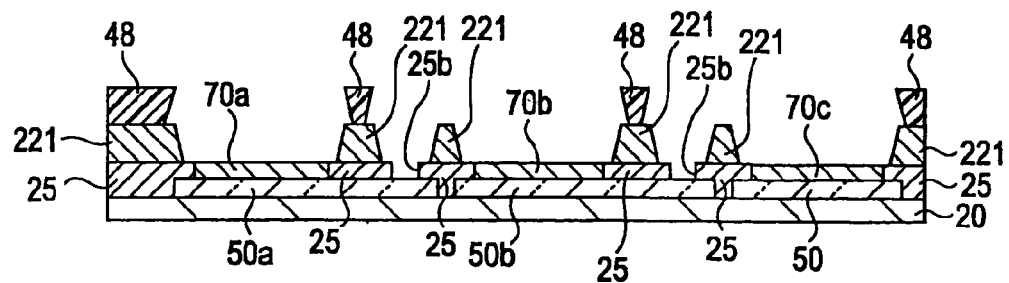
FIG. 9A-9B is a process diagram showing an example of a manufacturing process of the first substrate S1 made of the portion the organic EL device according to an exemplified embodiment of the invention.
Figure 9B:
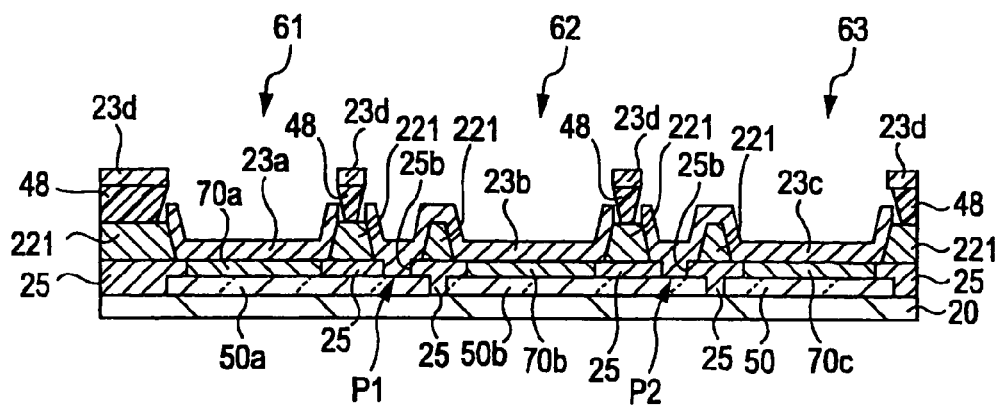

However, the electrode 23c formed on the upper portion of the light emitting film 70c is formed across the organic bank layer 221 so as to cover a portion of the transparent electrode 50b, the organic bank layer being formed between the opening section 25a where the light emitting film 70c is formed and the opening section 25b which is formed at the connection position shown by reference numeral P2. As shown in FIG. 9B, the electrode 23c is formed so as to be filled in the opening section 25b formed on the transparent electrode 50b. Therefore, the electrode 23c forming a portion of the organic EL element 63 and the transparent electrode 50b forming a portion of the organic EL element 62 are electrically connected to each other.

The electrode 23b formed on the light emitting film 70b is formed across the organic bank layer 221 so as to cover a portion of the transparent electrode 50a, the organic bank layer 221 being formed between the opening section 25a where the light emitting film 70b is formed and the opening section 25b which is formed at the connection position shown by reference numeral P1. As shown in FIG. 9B, the electrode 23b is formed so as to be filled in the opening section 25b formed on the transparent electrode 50a. Therefore, the electrode 23b forming a portion of the organic EL element 62 and the transparent electrode 50a forming a portion of the organic EL element 61 are electrically connected to each other. Accordingly, the organic EL elements 61, 62, and 63 which are connected in series are formed between the electrode 23a (the pixel electrode 23 shown in FIG. 1) and the common electrode 50.

The electrodes 23a, 23b, and 23c may be formed of a MgAg film or may be formed of a laminated film (LiF/Ca/Al) in which LiF, Ca, and Al are laminated in the above-mentioned order. Further, on the electrodes 23a, 23b, and 23c (as well as the conductive layer 23) formed in such a manner, a protecting layer such as $SiO_2$ or SiN for preventing oxidation may be provided.

Bonding Process between First Substrate S1 and Second Substrate S2

Finally, the first substrate S1 and second substrate S2 manufactured through the above-described processes are bonded to each other, thereby manufacturing the organic EL device 1. In this process, the conductive connection member 30 composed of sliver paste is disposed in the opening section 285a formed in the second substrate S2. Moreover, the conductive connection member 30 may be disposed in the electrode 23a. Next, the surface (which is formed by the electrodes 23a, 23b, and 23c) of the substrate 20 provided to the first substrate S1 is sealed by the second substrate S2.

Specifically, sealing resin composed of thermosetting resin or violet curing resin is coated on the circumferential edge of the surface of the substrate 21 provided to the second substrate S2 by a micro dispenser or the like. Next, the first substrate S1 is positioned and laminated on the sealing resin, and heating and ultraviolet irradiation are performed. At this time, the first substrate S1 is disposed so that the rear surface of the substrate 20 is directed toward the second substrate S2. Accordingly, the first and second substrates S1 and S2 are joined by the sealing resin, thereby forming a sealing section. Preferably, the sealing process is performed in an inert gas atmosphere such as nitrogen, argon, helium, or the like. When the sealing process is performed in the air, and when such a defect as a pin hole or the like is present in the electrodes 23a, 23b, and 23c, water, oxygen, or the like permeates into the electrodes 23a, 23b, and 23c from the defective portion. Then, the electrodes 23a, 23b, and 23c can be oxidized.

In the organic EL device according to the embodiment of the present invention and the method of manufacturing the same, the driving TFT 123 and the like are formed in the second substrate S2. However, elements which are previously formed on another transfer substrate may be transferred to the second substrate so that elements such as the driving TFT 123 and the like are provided in the second substrate S2. When this method is used, a separation layer is first formed on the transfer substrate, and a plurality of elements are formed thereon. At this time, the elements are formed in a state where the terminal sections thereof are exposed to the surface opposite to the separation layer.

The transfer substrate in which the plurality of elements are formed is disposed so that the surface to which the terminal sections of the elements to be transferred are exposed is directed toward the second substrate S2. Further, the transfer substrate is bonded to the second substrate S2 by using a conductive adhesive. Next, laser light is irradiated onto the separation layer of the transfer substrate so that the transfer substrate bonded to the second substrate S2 is separated from the second substrate S2. Then, with the transfer substrate being separated from the second substrate S2, some of the elements or all the elements are transferred to the second substrate S2. Further, this method allows elements to be provided in the first substrate S1.

Figure 10:
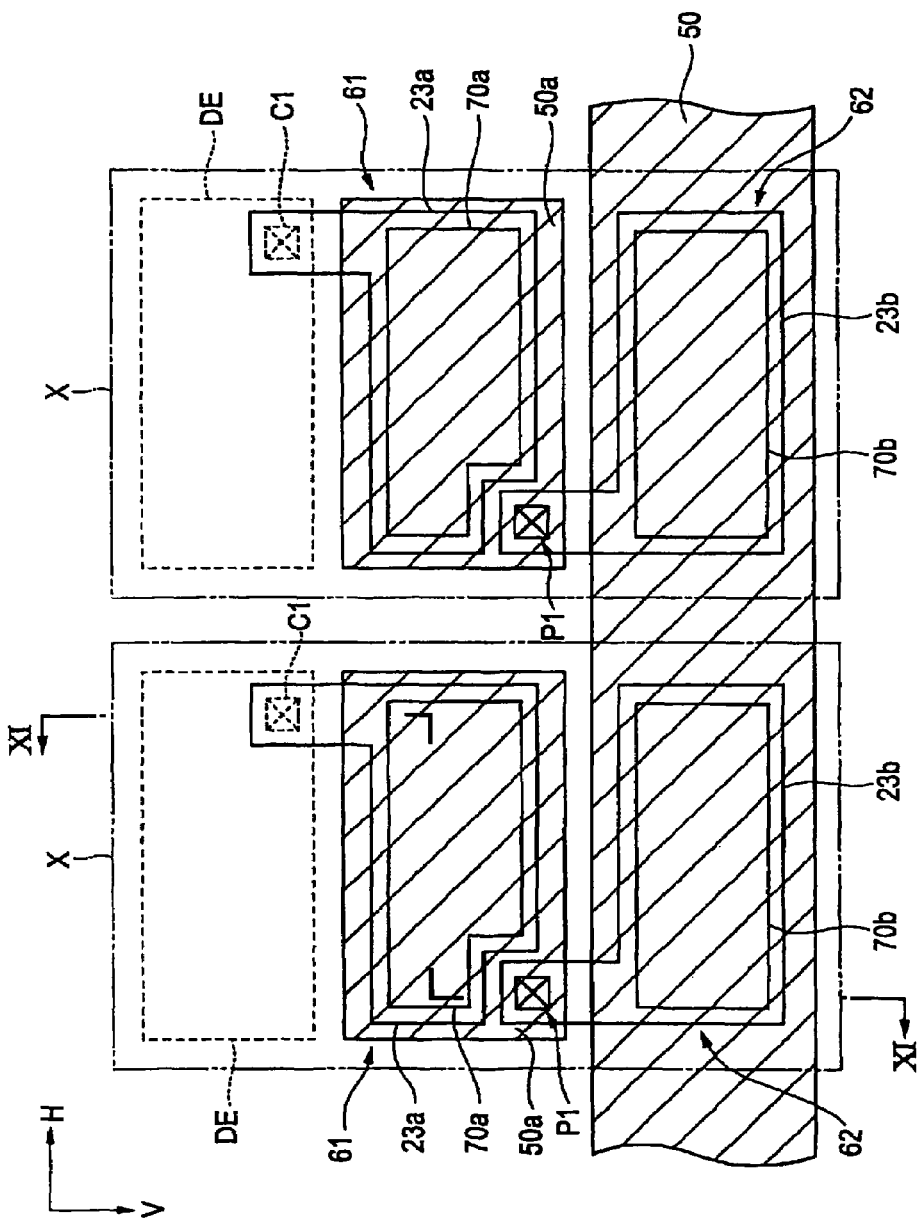
FIG. 10 is an enlarged transparent plan view showing a pixel region X according to another exemplified embodiment of the invention.

FIG. 10 is an enlarged transparent plan view illustrating a pixel region X having a structure according to another embodiment. In FIG. 10, two pixel regions X which are adjacent to each other in the H direction of FIG. 2 are enlarged, and the scanning lines 101, the signal lines 102, and the power lines 103, which are shown in FIG. 1, are omitted. As shown in FIG. 10, a driving circuit section DE including the switching TFT 112, the holding capacitor 113, and the driving TFT 123, which are shown in FIG. 1, and two organic EL elements 61 and 62 are formed in the pixel region X.

The organic EL element 61 includes a first pixel electrode 23a, a light emitting film 70a formed on the upper portion of the first pixel electrode 23a, and an electrode 50a formed on the upper portion of the light emitting film 70a. Further, the organic EL element 62 includes a second pixel electrode 23b, a light emitting film 70b formed on the upper portion of the second pixel electrode 23b, and a common electrode 50 formed on the upper portion of the light emitting film 70b. The first pixel electrode 23a provided in the organic EL element 61 corresponds to the pixel electrode 23 shown in FIG. 1. Further, as shown in FIG. 10, the common electrode 50 extends in the H direction of the drawing, and is commonly used by the organic EL elements 62 provided in the end portion of the pixel regions X in the V direction, which are arranged in the H direction.

The driving circuit section DE provided in the pixel region X and the first pixel electrode 23a of the organic EL element 61 are electrically connected through the contact hole C1. Further, the electrode 50a of the organic EL element 61 and the second pixel electrode 23b of the organic EL element 62 come in contact with each other at a place, where reference numeral P1 is attached, so as to be electrically connected. As such, between the driving circuit section DE and the common electrode 50, the organic EL elements 61 and 62 are connected in series.

Figure 11:
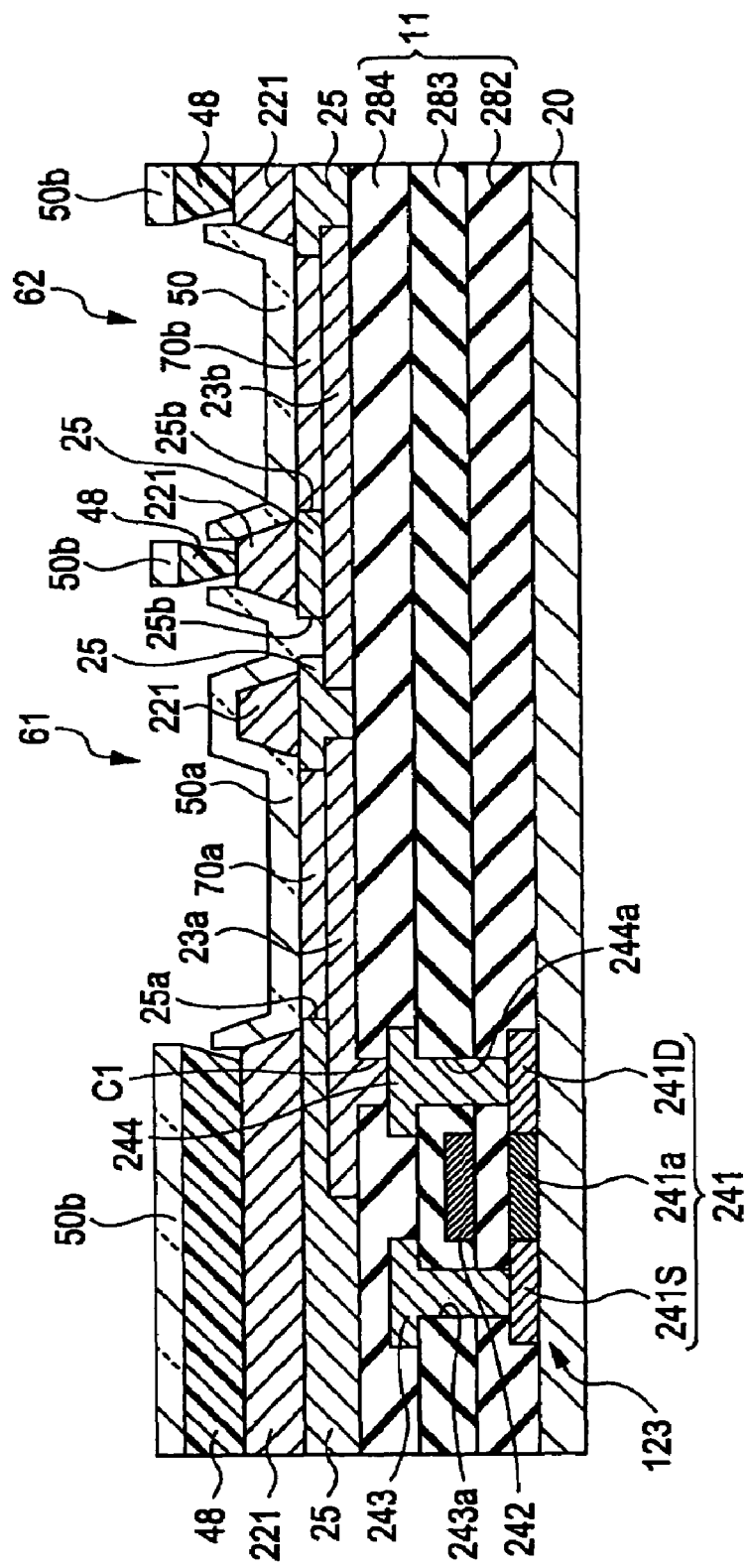
FIG. 11 is a cross-sectional vie taken along the XI-XI line of FIG. 10.

The cross-sectional structure of the pixel region X will be described in detail with reference to FIG. 11. FIG. 11 is a cross-sectional view taken along the XI-XI line of FIG. 10. As shown in FIG. 11, the driving circuit section DE and the organic EL elements 61 and 62, which are shown in FIG. 10, are formed on the substrate 20. In FIG. 11, only the driving TFT 123 among the components of the driving circuit section DE is shown. The organic EL device 1 of the present embodiment is a so-called top-emission-type organic EL device which extracts the emitted light, obtained from each pixel region X, from the side of the substrate 20. Therefore, as the substrate 20, a transparent or half-transparent substrate is used. For example, a glass substrate, a quartz substrate, a resin substrate (plastic or a plastic film), and the like are exemplified. In particular, a glass substrate is preferably used.

On the substrate 20, the driving circuit section DE including the driving TFT 123 for driving the pixel electrode 23 (the first pixel electrode 23a) is formed. The construction of the driving circuit section DE will be described, with the driving TFT 123 being exemplified. On the surface of the substrate 20, a base protecting layer (not shown) which mainly consists of $SiO_2$ is formed as a base, on which a silicon layer 241 is formed. On the surface of the silicon layer 241, a gate insulating layer 282 containing at least any one of $SiO_2$ and SiN is formed.

In the silicon layer 241, a region which is overlapped with the gate electrode 242 with the gate insulating layer 282 interposed therebetween is set to a channel region 241a. On the other hand, on the surface of the gate insulating layer 282 which covers the silicon layer 241 and in which the gate electrode 242 is formed, a first interlayer insulating layer 283 which mainly consists of $SiO_2$ is formed.

In the silicon layer 241, a source region 241S is provided in the source side of the channel region 241a, and a drain region 241D is provided in the drain side of the channel region 241a. Preferably, a low concentration source region and high concentration source region are formed at the source side of the channel region 241a, and a low concentration drain region and high concentration drain region are formed t the drain side of the channel region 241a, thereby forming a so-called LDD (lightly doped drain) structure.

Among them, the source region 241S is connected to the source electrode 243 through a contact hole 243a which is opened through the gate insulating layer 282 and the first interlayer insulating layer 283. The source electrode 243 is constructed as a portion of the above-described power line 103 (refer to FIG. 1) (which extends in the direction perpendicular to the paper surface at the position of the source electrode 243 in FIG. 11). On the other hand, the drain region 241D is connected to the drain electrode 244, composed of the same layer as the source electrode 243, through a contact hole 244a which is opened through the gate insulating layer 282 and the first interlayer insulating layer 283.

The upper layer of the first interlayer insulating layer 283 in which the source electrode 243 and the drain electrode 244 are formed is covered by a second interlayer insulating layer 284 which mainly consists of acryl-based resin. The second interlayer insulating layer 284 can be formed of, for example, SiN, $SiO_2$, or the like, except for the acryl-based insulating film. On the surface of the second interlayer insulating layer 284, the first pixel electrode 23a (the pixel electrode 23) and the second pixel electrode 23b, which are composed of ITO, are formed. The first pixel electrode 23a is connected to the drain electrode 244 through the contact hole C1 provided in the second interlayer insulating layer 284. In other words, the first pixel electrode 23a (the pixel electrode 23) is connected to the drain region 241D of the silicon layer 241 through the drain electrode 244.

The above-described components from the base protecting layer (not shown) formed on the upper portion of the substrate 20 to the second interlayer insulating layer 284 compose the circuit section 11. Moreover, the switching TFT 112 provided in the driving circuit section DE has the same structure as the driving TFT 123. The TFT (for a driving circuit) included in the scanning line driving circuit 80 and the checking circuit 90, that is, an N-channel-type or P-channel-type TFT forming an inverter included in the shift register in these driving circuits has the same structure as the driving TFT 123, except for when the TFT is not connected to the pixel electrode 23.

The surface of the second interlayer insulating layer 284 in which the first pixel electrode 23a (the pixel electrode 23) and the second pixel electrode 23b are formed is covered by the first and second pixel electrode 23a and 23b, the lyophilic control layer 25 which mainly consists of a lyophilic material such as $SiO_2$, and the organic bank layer 221 composed of acryl or polyimide. Moreover, the 'lyophilicity' of the lyophilic control layer 25 in the present embodiment means that the lyophilic control layer is more lyophilic than a material such as acryl or polyimide forming the organic bank layer 221.

In the lyophilic control layer 25, the plurality of opening sections 25a and 25b are formed. The opening section 25a is formed at the position where the organic EL elements 61 and 62 should be formed, and the opening section 25b is formed at the connection position between the electrode 50a of the organic EL element 61 and the second pixel electrode 23b of the organic EL element 62, which is shown by reference numeral P2 in FIG. 10. In the boundary between the respective display regions (pixel regions) including the organic EL elements 61 and 62, a black layer (BM, not shown) in which metallic chrome is film-formed by sputtering is positioned and formed between the organic bank layer 221 and the lyophilic control layer 25.

On the first and second pixel electrodes 23a and 23b, the light emitting films 70a and 70b are respectively provided. The light emitting films 70a and 70b serve to emit respective colors of light to each of the display regions R, G, and B shown in FIG. 2. As a material for forming the light emitting films 70a and 70b, the above-described light emitting material can be used, which emits fluorescent light or phosphor light.

In the above-described embodiment, only the light emitting films 70a, 70b, and 70c (as well as the hole injecting/transporting layer) are formed by using a droplet discharge method. However, the transparent electrodes 50a and 50b and the common electrode 50 as well as the lyophilic control layer 25 can be formed by using a droplet discharge method.

When the transparent electrodes 50a and 50b and the common electrode 50 are formed by using a droplet discharge method, an organic acid containing indium and tin is used as liquid material which is discharged from a droplet discharge device. On the substrate 20 shown in FIG. 8A, liquid material is discharged only at that position, where the transparent electrodes 50a and 50b and the common electrode 50 should be formed, by using the droplet discharge device.

After a solvent used for controlling the viscosity of the liquid material discharged from the droplet discharge device is evaporated (for example, at the temperature of about 100° C.), a first heat treating process and then a second heat treating process are sequentially performed. In the first heat treating process, heat treating process is performed in vacuum or an oxygen atmosphere at 250° C. to 405° C. for 30 to 60 minutes, thereby forming an indium oxide and tin oxide. In the second heat treating process, the reduction treatment is performed while heat treating process is performed in a hydrogen-containing atmosphere or reducing atmosphere at 200° C. to 400°

C. for 30 to 60 minutes. Through the first and second heat treating process, a mixed film (ITO film) of an indium oxide and tin oxide is formed.

The formation of the lyophilic control layer 25 using the droplet discharge method can be realized by using a self-assembled monolayer, for example. In order to form the self-assembled monolayer, at least one of organosilicon compound and thiol compound is melted in an organic solvent such as dichloromethane or trichloromethane. Then, about 0.1 to 10 mM of liquid is obtained so as to be used as liquid material which is discharged from the droplet discharge device.

After the transparent electrodes 50a and 50b and the common electrode 50 are formed on the substrate 20 shown in FIG. 8A, the liquid material is discharged at a predetermined position of the substrate 20 by using the droplet discharge device. Moreover, if the lyophilicity of the self-assembled monolayer with respect to the lyophilic control layer 25 is higher than that of the transparent electrodes 50a and 50b and the common electrode 50 as well as the substrate 20, the liquid material is discharged at the position where the lyophilic control layer 25 should be formed. Otherwise, the liquid material is discharged at the position excluding the position where the lyophilic control layer 25 should be formed. The self-assembled monolayer is formed at predetermined positions of the transparent electrodes 50a and 50b and the common electrode 50 as well as the substrate 20 by discharging the liquid material. When a self-assembled monolayer having a desired shape cannot be formed by the droplet discharge method, a self-assembled monolayer having a desired shape can be formed by using resist patterns.

Next, liquid material including a constituent material of the lyophilic control layer 25 is supplied as a mist onto the substrate 20, so that an insulating material (liquid) is selectively adhered on a portion where the self-assembled monolayer is formed and a portion where the self-assembled monolayer is not formed. Accordingly, an insulating film having a shape corresponding to the shape of the self-assembled monolayer is formed. Moreover, supplying the liquid as a mist can be realized by discharging an insulating material by the above-described droplet discharge device. The insulating film formed by the above-described processes is dried at a constant temperature for a constant time, thereby forming the lyophilic control layer 25.

Now, a method of manufacturing the organic EL device according to another embodiment of the present invention, which is shown in FIGS. 10 and 11, will be described.

FIGS. 12 to 14 show the following process where the contact hole C1 is formed in the second interlayer insulating layer 284 composed of oxidized silicon, the second interlayer insulating layer 284 being formed so as to cover the first interlayer insulating layer 283 as well as the source electrode 243 and the drain electrode 244.

On the surface of the second interlayer insulating layer 284, the first pixel electrode 23a and the second pixel electrode 23b, which are composed of ITO or the like, are formed. Specifically, an ITO film is first formed on the overall surface of the second interlayer insulating layer 284. The formation of the ITO film is performed by a vacuum evaporation method or the like. The vacuum evaporation method is where an ITO sintered body is heated in vacuum to evaporate the ITO and is then deposited on the surface of the second interlayer insulating layer 284. At this time, ITO is filled in the contact hole C1. Next, the ITO film is patterned by using a photolithographic technique and dry etching. Accordingly, the first pixel electrode 23a and the second pixel electrode 23b are formed on the surface of the second interlayer insulating layer 284 (refer to FIG. 12B)

On the second interlayer insulating layer 284 excluding the upper portions of the first and second pixel electrodes 23a and 23b where the light emitting films 70a and 70b should be formed, the lyophilic control layer 25 which mainly consists of, for example, $SiO_2$ is formed, similar to the case of the previous embodiment.

Figure 12A:
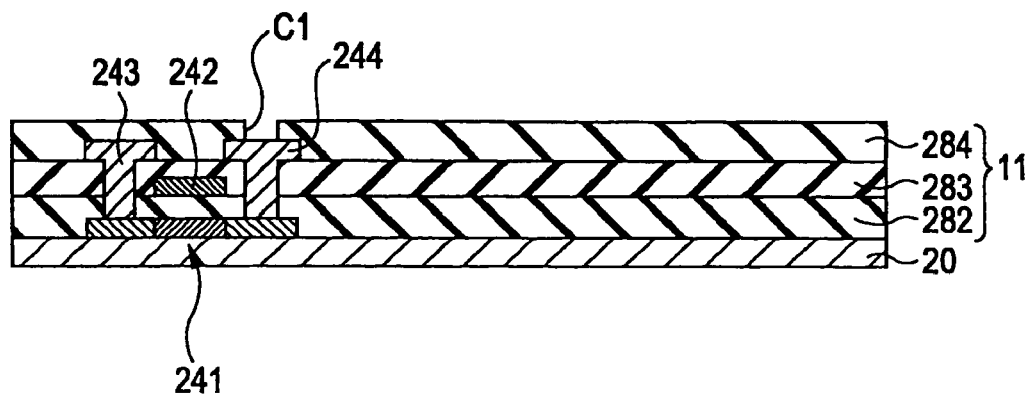
FIG. 12A-12C is a process diagram showing an example of a method of manufacturing the organic EL device according to another embodiment of the invention.
Figure 12B:
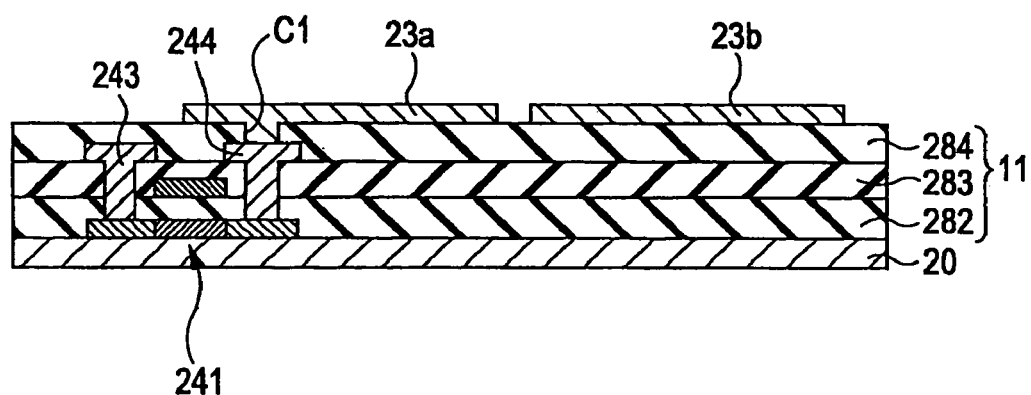
Figure 12C:
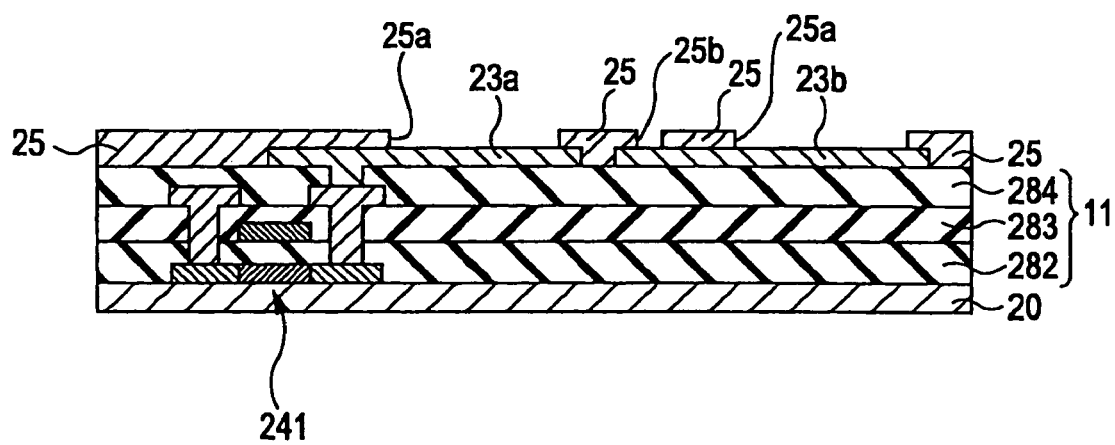

By using a photolithographic technique or dry etching method, the opening section 25a is formed at the position where the light emitting films 70a and 70b should be formed, and the opening section 25b is formed at the position which becomes the connection position between the electrode 50a of the organic EL element 61 and the second pixel electrode 23b of the organic EL element 62 (refer to FIG. 12C). After that, a BM (not shown) is formed in the space of a region which should become the pixel region. Specifically, on the convex-shaped portion of the lyophilic control layer 25, metallic chrome is film-formed by a sputtering method.

As shown in FIG. 13A, the organic bank layer 221 is formed at a predetermined position of the lyophilic control layer 25. Specifically, the organic bank layer 221 is formed as follows: resist such as acrylic resin or polyimide resin is melted in a solvent and the melted resist is coated by various coat methods such as a spin coat method, a dip coat method, and the like, thereby forming an organic layer. Preferably, the constituent material of the organic layer is such a material that is easily patterned by etching or the like, without being melted in a solvent which is used when the light emitting films 70a and 70b to be described below are formed. Subsequently, the organic layer is patterned by using a photolithographic technique and an etching method, so that the organic bank layer 221 is formed on a predetermined position of the lyophilic control layer 25.

As shown in FIG. 13B, the reversed-tapered resist layer 48 is formed on a predetermined position of the organic bank layer 221. Specifically, the resist layer 48 is formed as follows: resist is melted in a solvent and the melted resist is coated by various coat methods such as a spin coat method, a dip coat method, and the like, thereby forming a resist layer. Preferably, the constituent material of the resist layer is such a material that is easily patterned by an etchant (which does not melt the organic bank layer 221) which is used at the time of etching, without being melted in a solvent which is used when the light emitting films 70a and 70b to be described below are formed. When the resist layer is formed, patterning is performed by using the etchant. Accordingly, the resist layer 48 having a tapered shape which is reverse to the tapered shape of the organic bank layer 221 is formed at a predetermined position of the organic bank layer 221. Moreover, on the organic bank layer 221 formed between the opening section 25a, which is formed in the position where the light emitting film of the organic EL element 61 should be formed, and the opening section 25b, the resist layer 48 is not formed.

When the above processes are completed, the surface of the first and second pixel electrodes 23a and 23b as well as the organic bank layer is subjected to plasma processing. The plasma processing is focused on the activation of the surface of the first and second pixel electrodes 23a and 23b as well as the lyophilization/repellency treatment of the surface of the first and second pixel electrodes 23a and 23b and the organic bank layer 221. In particular, the activation of the surface of the first and second pixel electrodes 23a and 23b is mainly focused on cleaning the surfaces of the first and second pixel electrodes 23a and 23b and adjusting a work function.

As the preprocess of the plasma processing, the substrate 20 is preheated at a predetermined temperature. The predetermined temperature is in the range of about 70 to 80° C. Next, focused on the activation of the surface of the first and second pixel electrodes 23a and 23b and the lyophilization of the surface of the first and second pixel electrodes 23a and 23b and the organic bank layer 221, first plasma processing is performed. In the first plasma processing, plasma processing ($O_2$ plasma processing) with an oxygen gas set to a processing gas is performed at atmospheric pressure and under a vacuum. By the first plasma processing, the electrode surface of the first and second pixel electrodes 23a and 23b are cleaned, and the adjustment of the work function is performed. Further, on the electrode surface of the first and second pixel electrodes 23a and 23b and the surface of the organic bank layer 221, hydroxyl is introduced, so that the lyophilicity is applied.

Focused on the repellency treatment of the surface of the organic bank layer 221, second plasma processing is performed. In the second plasma processing, plasma processing ($CF_4$ plasma processing) with a $CF_4$ gas set to a processing gas is performed at atmosphere pressure and under vacuum. As a processing gas, another fluorocarbon-based gas can be used, without being limited to a $CF_4$ gas. By the second plasma processing, fluorine is introduced onto the upper surface of the organic bank layer 221, so that the repellency is applied. Moreover, organic matters such as polyimide resin forming the organic bank layer 221 are easily fluorinated by irradiating fluorocarbon in a plasma state. Further, in the present embodiment, the $O_2$ plasma processing is performed as the preprocessing of the $CF_4$ plasma processing. Therefore, the organic bank layer 221 can be further easily fluorinated. Finally, the substrate 20 subjected to the plasma processing is cooled down to the control temperature of the next process.

Figure 14A:
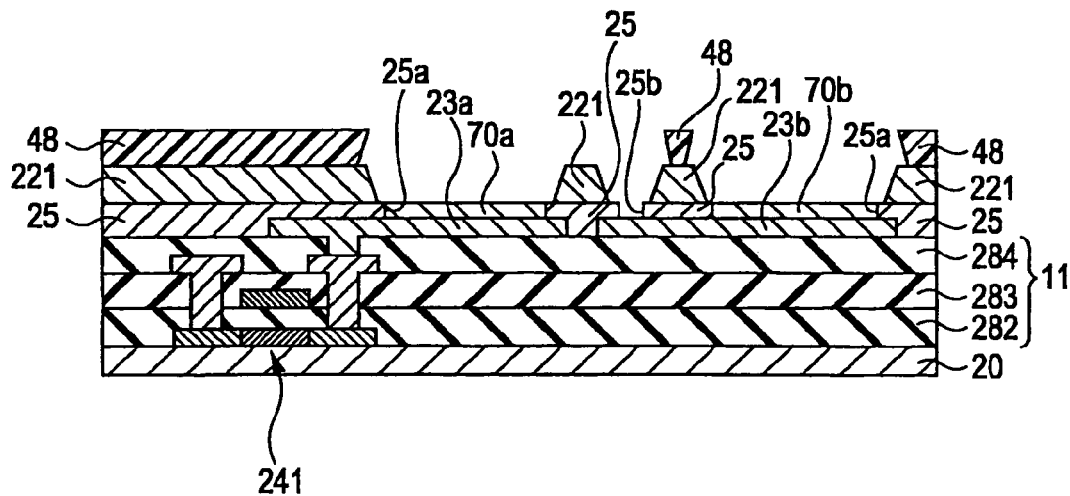
FIG. 14A-14B is a process diagram showing an example of the method of manufacturing the organic EL device according to another exemplified embodiment of the invention.

When the above-described processes are completed, the light emitting films 70a and 70b are respectively formed on the surface of the first and second pixel electrodes 23a and 23b, inside the openings 25a (refer to FIG. 14A). Moreover, prior to the formation of the light emitting films 70a and 70b, hole injecting/transporting layers are formed on the respective surfaces of the first and second pixel electrodes 23a and 23b. On the hole injecting/transporting layers, the light emitting films 70a and 70b are preferably formed. The formation process of the light emitting films 70a and 70b (as well as the formation process of the hole injecting/transporting layer) is preferably performed in an atmosphere without water and oxygen. For example, the formation process can be performed in an inert gas atmosphere such as nitrogen or argon. Afterwards, such a case will be exemplified and described where the light emitting films 70a and 70b are formed after the hole injecting/transporting layer is formed.

The formation of the hole injecting/transporting layer and the light emitting films 70a and 70b is performed by discharging droplets of liquid material including forming materials thereof toward the first and second pixel electrodes 23a and 23b. Discharging the liquid material is performed by using a droplet discharge device. First, the hole injecting/transporting layer is formed on each surface of the first and second pixel electrodes 23a and 23b. Specifically, the droplets of liquid material in which a forming material of the hole injecting/transporting layer is melted in a polar solvent are discharged onto the surface of the first and second pixel electrodes 23a and 23b. The discharged liquid material spreads onto the inner circumferential surface of the opening section 25a along the respective surfaces of the first and second pixel electrodes 23a and 23b which are subjected to the lyophilization treatment.

Next, drying process is performed through heating or light-irradiation so as to evaporate the polar solvent contained in the liquid material. On the first and second pixel electrodes 23a and 23b, the evaporation rate of the polar solvent becomes substantially uniform, and the forming material of the hole injecting/transporting layer is concentrated uniformly. Accordingly, the hole injecting or transporting layer having a uniform thickness is formed on the electrode surface of the first and second pixel electrodes 23a and 23b. When the hole injecting/transporting layer with a desired thickness cannot be not obtained by one-round of the discharging process by the droplet discharge device and the drying process, the discharging process and the drying process may be repeated a plurality of times.

Subsequently, on the surface of the hole injecting/transporting layer, the light emitting films 70a and 70b are formed. Moreover, prior to this, the hole injecting/transporting layer is surface-modified. The formation of the light emitting films 70a and 70b is performed as follows: the droplets of liquid material in which the forming material of the light emitting films 70a and 70b is melted in a non-polar solvent is discharged onto the surface of the hole injecting/transporting layer by using the droplet discharge device. The discharged liquid material spreads in a layer shape up to the side surface of the organic bank layer 221 along the surface of the hole injecting/transporting layer. Since the upper surface and side surface of the organic bank layer 221 is subjected to the repellency treatment, the liquid material for forming the light emitting film 70a does not flow in the forming region of the light emitting film 70b beyond the organic bank layer 221, in one pixel region X. Further, it becomes unlikely that the liquid discharged in one pixel region X flows in another pixel region X beyond the organic bank layer 221.

Similar to the case of the hole injecting/transporting layer, the discharged liquid material is dried (and heated), thereby forming the light emitting films 70a and 70b. As such, the red (R), green (G), and blue (B) light emitting films 70a and 70b are formed in each pixel region X. In the present embodiment, even though the light emitting films 70a and 70b are formed of a high-molecular material, the light emitting films 70a and 70b may be formed of a low-molecular material by using an evaporation method. In particular, the blue light emitting film is preferably formed of a low-molecular material, because a low-molecular material contains a larger amount of material that is sufficient for the lifetime of the light emitting film than a high-molecular material.

Figure 14B:
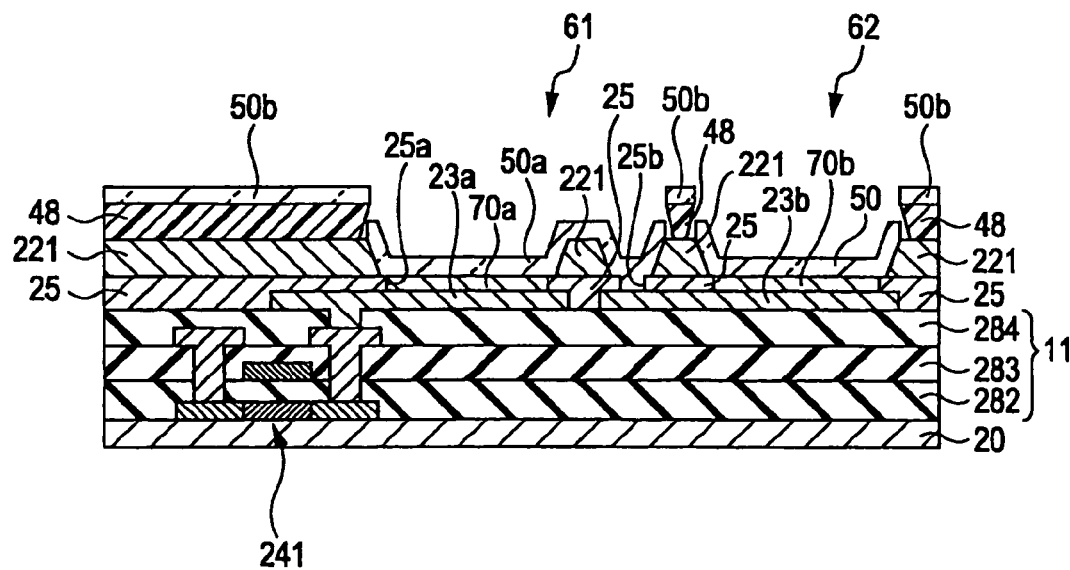

When the above-described processes are completed, the electrode 50a is formed on the upper portion of the light emitting film 70a, and the common electrode 50 is formed on the upper portion of the light emitting film 70b (refer to FIG. 14B). Specifically, LiF and Al are laminated in the above-mentioned order by an evaporation method or the like, thereby forming a laminated film (LiF/Al). The laminated film is formed on the upper surface of the light emitting films 70a and 70b and the resist layer 48, but the resist layer 48 is formed in a reversed-tapered shape. Therefore, the laminated film formed on a partition wall is insulated from the laminated film formed on the other portions (the light emitting films 70a and 70b). Accordingly, the electrode 50a is formed on the upper portion of the light emitting film 70a, and the common electrode 50 is formed on the upper portion of the light emitting film 70b. The laminated film on the resist layer 48 becomes the conductive layer 50b, but the conductive layer 50b cannot be used in driving the organic EL device.

However, the electrode 50 formed on the upper portion of the light emitting film 70a is formed across the organic bank layer 221 so as to cover a portion of the second pixel electrode 23b, the organic bank layer being formed between the opening section 25a where the light emitting film 70a is formed and the opening section 25b. As shown in FIG. 14B, the electrode 50a is formed so as to be filled in the opening section 25b formed on the second pixel electrode 23b. Therefore, the electrode 50a forming a portion of the organic EL element 61 and the second pixel electrode 23b forming a portion of the organic EL element 62 are electrically connected to each other. Accordingly, the organic EL elements 61 and 62 connected in series are formed between the first pixel electrode 23a (the pixel electrode 23 shown in FIG. 1) and the common electrode 50.

The electrode 50a and the common electrode 50 may be formed of a MgAg film or may be formed of a laminated film (LiF/Ca/Al) in which LiF, Ca, and Al are laminated in the above-mentioned order. Further, on the electrode 50a and the common electrode 50 (as well as the conductive layer 50b) formed in such a manner, a protecting layer such as $SiO_2$ and SiN for preventing oxidation may be provided.

Finally, the rear surface of the substrate 20 (the surface on which the common electrode 50 and the like are formed) is sealed by a sealing substrate (not shown). Specifically, sealing resin composed of thermosetting resin or violet curing resin is coated on the circumferential edge of the rear surface of the substrate 20 by a micro dispenser or the like. Next, the sealing substrate is laminated on the sealing resin, and heating and ultraviolet irradiation are performed. Accordingly, the substrate 20 and the sealing substrate are joined through the sealing resin, thereby forming a sealing section. Preferably, the sealing process is performed in an inert gas atmosphere such as nitrogen, argon, helium, or the like. When the sealing process is performed in the air, and when a defect such as a pin hole or the like is present in the common electrode 50 and the like, water, oxygen, or the like penetrates into the common electrode 50 and the like from the defective portion. Then, the common electrode 50 and the like can be oxidized.

In the above-described organic EL device according to the embodiment of the invention and the manufacturing method thereof, only the light emitting films 70a and 70b (as well as the hole injecting/transporting layer) is formed by the droplet discharge method. However, the first and second electrodes 23a and 23b as well as the lyophilic control layer 25 can be formed by using the droplet discharge method.

When the first and second pixel electrodes 23a and 23b are formed by using the droplet discharge method, an organic acid containing indium and tin is used as liquid material which is discharged from a droplet discharge device. After the second interlayer insulating layer 284 shown in FIG. 12A is formed and the contact hole C1 is formed in the second interlayer insulating layer 284, liquid material is discharged only on the position of the second interlayer insulating layer 284, where the first and second pixel electrodes 23a and 23b should be formed, and only inside the contact hole C1, by using the droplet discharge device.

After a solvent used for controlling the viscosity of the liquid material discharged from the droplet discharge device is evaporated (for example, at the temperature of about 100° C.), the following first and second heat treating process is sequentially performed. In the first heat treating process, heat treating process is performed in a vacuum or an oxygen atmosphere at 250° C. to 405° C. for 30 to 60 minutes, thereby forming an indium oxide and tin oxide. In the second heat treating process, the reduction treatment is performed while heat treating process is performed in a hydrogen-containing atmosphere or reducing atmosphere at 200° C. to 400° C. for 30 to 60 minutes. Through the first and second heat treating process, a mixed film (ITO film) of an indium oxide and tin oxide is formed.

The formation of the lyophilic control layer 25 using the droplet discharge method can be realized by using a self-assembled monolayer, for example. In order to form the self-assembled monolayer, at least one of organosilicon compound and thiol compound is melted in an organic solvent such as dichloromethane or trichloromethane. Then, about 0.1 to 10 mM of liquid is obtained so as to be used as liquid material which is discharged from the droplet discharge device.

After the first and second pixel electrodes 23a and 23b are formed on the second interlayer insulating layer 284 shown in FIG. 12B, the liquid material is discharged at a predetermined position of the substrate 20 by using the droplet discharge device. Moreover, if the lyophilicity of the self-assembled monolayer with respect to the lyophilic control layer 25 is higher than that of the substrate 20 (the second interlayer insulating layer 284 as well as the first and second pixel electrodes 23a and 23b), the liquid material is discharged at the position where the lyophilic control layer 25 should be formed. Otherwise, the liquid material is discharged at the position excluding the position where the lyophilic control layer 25 should be formed. The self-assembled monolayer is formed at a predetermined position of the second interlayer insulating layer 284 as well as the first and second pixel electrodes 23a and 23b by discharging the liquid material. When a self-assembled monolayer having a desired shape cannot be formed by the droplet discharge method, a self-assembled monolayer having a desired shape can be formed by using resist patterns.

Next, liquid material including a constituent material of the lyophilic control layer 25 is applied as a mist onto the substrate 20, so that an insulating material (liquid) is selectively adhered on a portion where the self-assembled monolayer is formed and a portion where the self-assembled monolayer is not formed. Accordingly, an insulating film having a shape corresponding to the shape of the self-assembled monolayer is formed. Moreover, applying the liquid as a mist can be realized by discharging an insulating material by the above-described droplet discharge device. If the insulating film formed by the above-described processes is dried at constant temperature for a constant time, the lyophilic control layer 25 can be formed.

Figure 16:
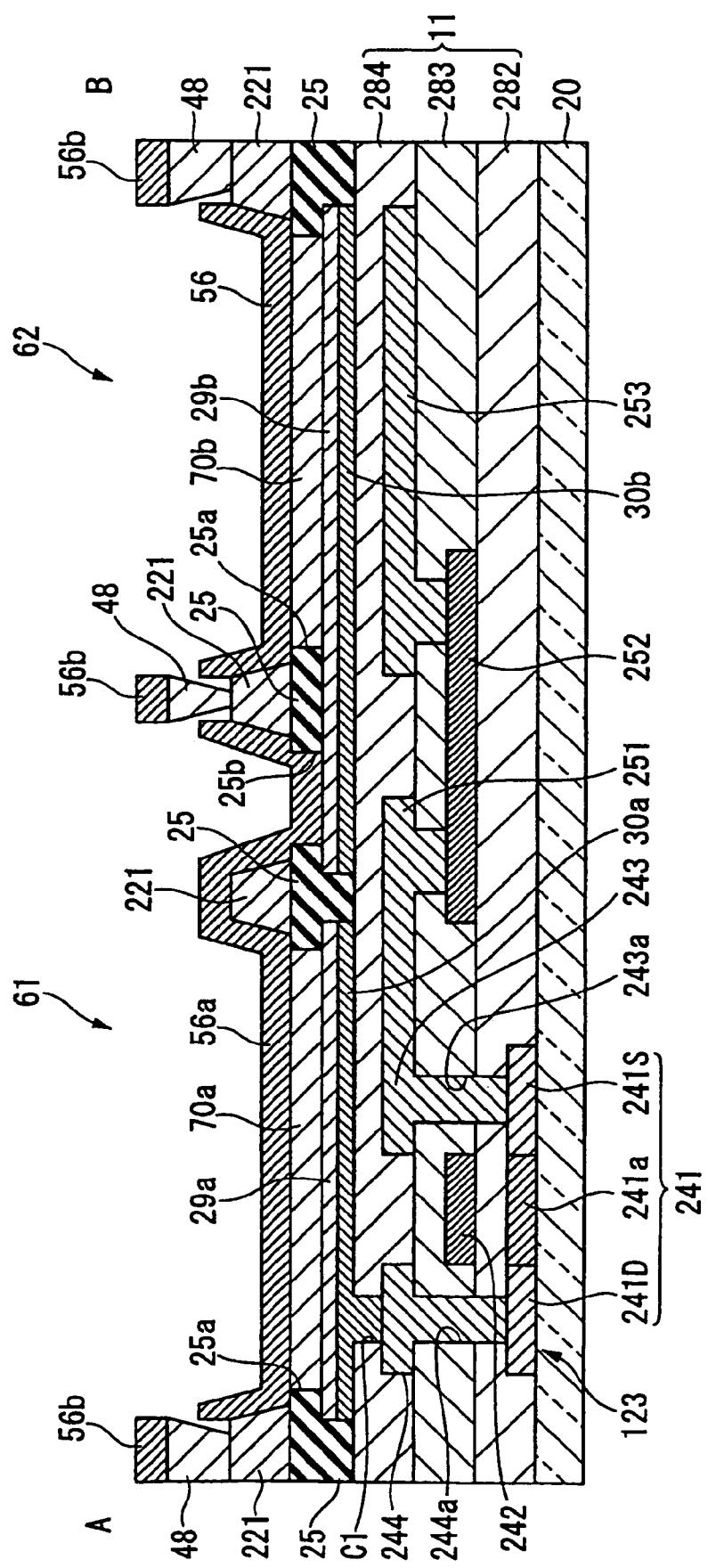
FIG. 16 a cross-sectional view taken along the V-V line of FIG. 15.
Figure 17A:
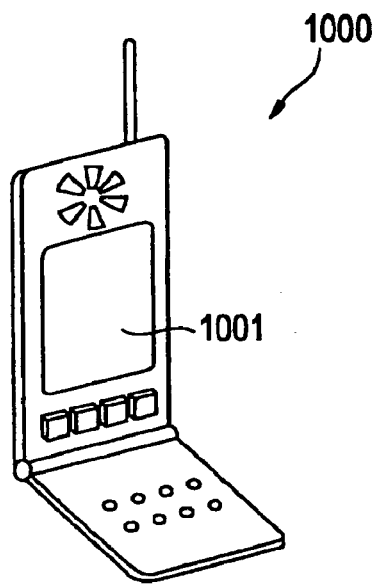
FIG. 17A-17C is a diagram showing examples of an electronic apparatus of the invention.
Figure 17B:
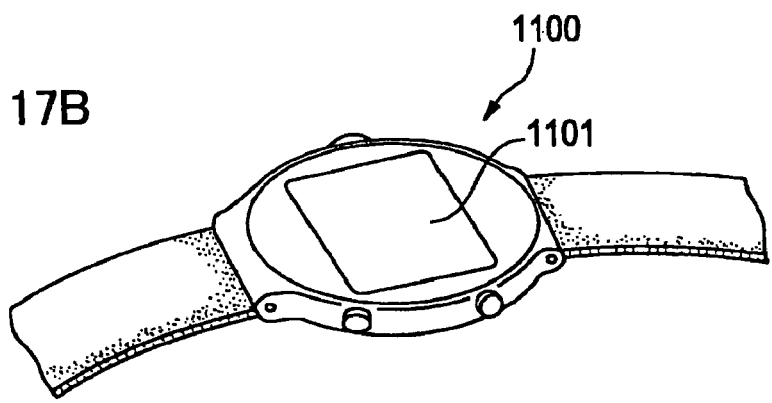
Figure 17C:
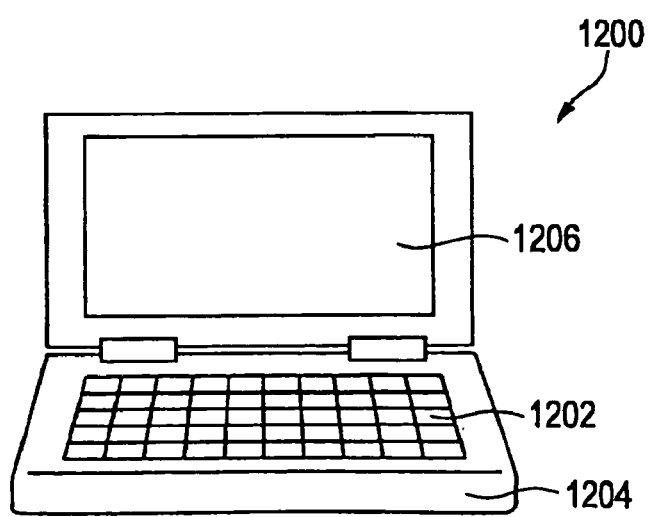

The following embodiment related to an aspect of the present invention is an organic EL device having the so-called top-emission structure. FIGS. 15 and 16 show a plan view and a cross-sectional view of the connection structure of organic EL element 61 and organic EL element 62 in the organic EL device having a top-emission structure, respectively. Driving TFT 123 included in driving circuit section DE controls in a lump emission of Organic EL element 61 and organic EL element 62, which are connected in series. Organic EL element 61 is driven by driving TFT 123. Organic EL element 61 includes light emitting film 70a. Light emitting film 70a is disposed between pixel electrode 29a above which light emitting film 70a is formed and which functions as an anode and upper electrode 56a that is formed above light emitting film 70a and that function as a cathode. Driving TFT 123 overlaps pixel electrode 29a. Organic EL element 62 includes light emitting film 70b. Light emitting film 70b is disposed between pixel electrode 29b above which light emitting film 70b is formed and common electrode 56 that is formed above light emitting film 70b. Lyophilic control layer 25 on which organic bank layer 221 having a tapered shape is formed surrounds light emitting film 70a. Resist layer 48 having a reversed-tapered shape is formed on organic bank layer 221 that also surrounds light emitting film 70*a*. Resist layer 48 is formed along the periphery of light emitting film 70*a*. A part of upper surface of organic bank layer 221 contacts resist layer 48. An area of the lower face of resist layer 48 through which resist layer 48 contacts organic bank layer 221 is smaller than an area of the upper face of resist layer 48. Resist layer 48 contacts upper electrode 56*b* that is formed above resist layer 48. Upper electrode 56*b* contacts neither upper electrode 56*a* nor common electrode 56. Lyophilic control layer 25 is formed on a part of pixel electrode 29*b*. Lyophilic control layer 25 surrounds light emitting film 70*b*. Organic bank layer 221 having a tapered shape is formed on lyophilic control layer 25 and surrounds common electrode 56. Resist layer 48 having a reversed-tapered shape is formed on organic bank layer 221 and surrounds common electrode 56. Pixel electrode 29*b* formed for organic EL element 62 contacts upper electrode 56*a* formed on organic EL element 61. Upper electrode 56*a* of organic EL element 61 does not contact common electrode 56. Upper electrode 56*a* is insulated from common electrode 56 by organic bank layer 221 and resist layer 48 which are formed between upper electrode 56*a* and common electrode 56. Upper electrode 56*a* of organic EL element 61 covers a part of pixel electrode 29*b* of organic EL element 62 and organic bank layer 221 on which resist layer 48 is not formed. Upper electrode 56*a* overlaps pixel electrode 29*b* at contact section P1 through which upper electrode 56*a* is connected to pixel electrode 29*b*. The configuration makes organic EL element 61 connected to organic EL element 62 in series. Upper electrode 56*a* and common electrode 56 may be formed by co-deposition of metal materials such as Ag and Mg. The thickness or materials of upper electrode 56*a* or common electrode 56 may be adjusted such that a light from light emitting film 70*a* or 70*b* transmits upper electrode 56*a* or common electrode 56, respectively. For example, a range of typical values of the thickness for a film formed by co-deposition of Mg and Ag as upper electrode 56a and common electrode 56 may be 10-100 nm. The light from light emitting films 70*a* or 70*b* is effectively outputted from a surface of organic EL device opposite to substrate 20 with regard to light emitting films 70*a* and 70*b* if reflection layers 30*a* and 30*b* are formed below pixel electrodes 29*a* and 29*b*, respectively, as shown in FIG. 16. Reflection layers 30*a* and 30*b* may formed of Al. The organic EL device may have light blocking films formed below pixel electrodes 29*a* and 29*b*. Wiring lines 251, 252, and 253 that can function as the light blocking films are formed between substrate 20 and pixel electrodes 29*a* and 29*b*. Electronic Apparatus Now, an electronic apparatus of the present invention will be described. The electronic apparatus of the invention is provided with the organic EL device 1 as a display section. Specifically, apparatuses shown in FIG. 17 are exemplified. FIG. 17A is a diagram showing examples of the electronic apparatus of the invention. FIG. 17A is a perspective view illustrating an example of a mobile phone. In FIG. 17A, a mobile phone 1000 is provided with a display section 1001 using the above-described organic EL device 1. FIG. 17B is a perspective view illustrating an example of a wristwatch type electronic apparatus. In FIG. 17B, a watch 1100 is provided with a display section 1101 using the above-described organic EL device 1. FIG. 17C is a perspective view illustrating an example of a portable information-processing device such as a word processor or a personal computer. In FIG. 17C, an information-processing device 1200 is provided with an input section 1202 such as a keyboard, a display section 1206 using the above-described organic EL device 1, and an information-processing device main body (case) 1204. The respective electronic apparatuses shown in FIGS. 17A to 17C are provided with the display sections 1001, 1101, and 1206 having the above-described organic EL device 1. Therefore, the electronic apparatus having an excellent display characteristic is provided.

The organic EL device 1 of the present embodiment can be applied to various electronic apparatuses such as a viewer, a personal digital assistant such as a game machine, an electronic book, an electronic paper, in addition to the above-described electronic apparatuses. Further, the organic EL device 1 can also be applied to various electronic apparatuses such as a video camera, a digital camera, a car navigation system, a car stereo, a driving control panel, a personal computer, a printer, a scanner, a television, a video player, and the like.

What is claimed is:

1. A light emitting device that includes a first pixel region formed above a substrate, comprising:
    a first and a second light emitting elements formed in the first pixel region, the first light emitting element being electrically connected to the second light emitting element; and
    a driving transistor physically connected to the first light emitting element.

2. The light emitting device according to claim 1, further comprising:
    a third light emitting element formed in the first pixel region,
    the second light emitting element being positioned between the first light emitting element and the third light emitting element, the third light emitting element being electrically connected to the second light emitting element.

3. The light emitting device according to claim 1, further comprising:
    a second pixel region electrically connected to the first pixel region.

4. The light emitting device according to claim 1, further comprising:
    a first scanning line;
    a first data line intersecting the first scanning line;
    a second scanning line; and
    a second data line intersecting the second scanning line, the first pixel region being surrounded by the first scanning line, the first data line, the second scanning line and the second data line.

5. The light emitting device according to claim 4, further comprising:
    a first driving circuit connected to the first and second data lines; and
    a second driving circuit connected to the first and second scanning lines.

6. The light emitting device according to claim 1, further comprising:
    a first scanning line;
    a first power line intersecting the first scanning line;
    a second scanning line; and
    a second power line intersecting the second scanning line, the first pixel region being surrounded by the first scanning line, the first power line, the second scanning line, and the second power line.

7. An electronic apparatus including the light emitting device according to claim 1.

8. The light emitting device according to claim 1,
    the first electrode of the first light emitting element being connected to the second electrode of the second light emitting element, the first electrode of the first light emitting element being connected to the first electrode of the second light emitting element via an insulating member, the insulating member having a tapered shape.

9. A light emitting device, comprising:
a first substrate including a first pixel region;
a first light emitting element formed in the first pixel region of the first substrate, the first light emitting element including a first electrode formed above the first substrate, and a second electrode, and a first light emitting film positioned between the first electrode and the second electrode;
a second light emitting element formed in the first pixel region of the first substrate, the second light emitting element including a third electrode formed above the first substrate and a fourth electrode, and a second light emitting film positioned between the third electrode and the fourth electrode, the fourth electrode being electrically connected to the first electrode;
a first insulating member including a first portion and a second portion, the first portion being formed between the first electrode and the third electrode, and the second portion being positioned on the first portion and between the first light emitting film and the second light emitting film;
a second insulating member formed between the second electrode and the fourth electrode, the second insulating member having a first tapered shape; and
a third insulating member provided with the second insulating member, the third insulating member having a second tapered shape reverse to the first tapered shape.

10. The light emitting device according to claim 9, further comprising:
a second substrate;
a transistor formed above the second substrate; and
a conductive connection member electrically connecting the second electrode and the transistor, the conductive connection member being positioned between the first light emitting element and the transistor.

11. The light emitting device according to claim 9, further comprising:
a plurality of scanning lines; and
a plurality of data lines, the first pixel region being positioned where one of the plurality of data lines intersects one of the plurality of scanning lines.

12. The light emitting device according to claim 9, further comprising:
a second pixel region electrically connected to the first pixel region.

13. The light emitting device according to claim 9, the first electrode and third electrode being transparent.

14. A light emitting device, comprising:
a first substrate including a first pixel region and a second pixel region adjacent to the first pixel region;
a first light emitting element formed in the first pixel region of the first substrate, the first light emitting element including a first electrode formed above the first substrate, and a second electrode, and a first light emitting film positioned between the first electrode and the second electrode;
a second light emitting element formed in the first pixel region of the first substrate, the second light emitting element including a third electrode formed above the first substrate and a fourth electrode, and a second light emitting film positioned between the third electrode and the fourth electrode, the fourth electrode being electrically connected to the first electrode;
a third light emitting element formed in the second pixel region of the first substrate, the third light emitting element including a fifth electrode formed above the first substrate, and a sixth electrode, and a third light emitting film positioned between the fifth electrode and the sixth electrode; and
a fourth light emitting element formed in the second pixel region of the first substrate, the fourth light emitting element including a seventh electrode formed above the first substrate and a eight electrode, and a fourth light emitting film positioned between the seventh electrode and the eight electrode, the eighth electrode being electrically connected to the fifth electrode, wherein
the third electrode is electrically connected to the seventh electrode.

15. The light emitting device according to claim 14, further comprising:
a first transistor physically connected to the first light emitting element; and
a second transistor physically connected to the third light emitting element.

16. The light emitting device according to claim 15, further comprising:
a second substrate above which the first transistor and the second transistor are formed;
a first conductive connection member electrically connecting the second electrode and the first transistor, the first conductive connection member being disposed between the first substrate and the second substrate; and
a second conductive connection member electrically connecting the sixth electrode and the second transistor, the second conductive connection member being disposed between the first substrate and the second substrate.

* * * * *